United States Patent
Shumate et al.

(10) Patent No.: US 9,960,287 B2
(45) Date of Patent: May 1, 2018

(54) SOLAR CELLS AND METHODS OF FABRICATION THEREOF

(71) Applicant: PICASOLAR, INC., Fayetteville, AR (US)

(72) Inventors: Seth Daniel Shumate, Fayetteville, AR (US); Douglas Arthur Hutchings, Elkins, AR (US); Hafeezuddin Mohammed, Fayetteville, AR (US); Matthew Young, Fayetteville, AR (US); Scott Little, Fayetteville, AR (US)

(73) Assignee: PICASOLAR, INC., Fayettevile, VA (US)

( * ) Notice: Subject to any disclaimer, the term of this patent is extended or adjusted under 35 U.S.C. 154(b) by 230 days.

(21) Appl. No.: 14/178,216

(22) Filed: Feb. 11, 2014

(65) Prior Publication Data
US 2015/0228810 A1 Aug. 13, 2015

(51) Int. Cl.
*H01L 31/0216* (2014.01)
*H01L 31/18* (2006.01)
*H01L 31/0224* (2006.01)
*H01L 31/068* (2012.01)

(52) U.S. Cl.
CPC .. *H01L 31/02167* (2013.01); *H01L 31/02168* (2013.01); *H01L 31/022433* (2013.01); *H01L 31/068* (2013.01); *H01L 31/1864* (2013.01); *H01L 31/1868* (2013.01); *Y02E 10/547* (2013.01); *Y02P 70/521* (2015.11)

(58) Field of Classification Search
CPC ...................................................... H01L 31/00
See application file for complete search history.

(56) References Cited

U.S. PATENT DOCUMENTS

| | | | |
|---|---|---|---|
| 4,142,195 A | 2/1979 | Carlson et al. |
| 5,871,591 A | 2/1999 | Ruby et al. |
| 6,339,013 B1 | 1/2002 | Naseem et al. |
| 6,613,653 B2 | 9/2003 | Naseem et al. |
| 6,755,151 B2 | 6/2004 | Deng et al. |
| 6,844,248 B2 | 1/2005 | Naseem et al. |
| 7,202,143 B1 | 4/2007 | Naseem et al. |
| 7,601,215 B1 | 10/2009 | Wang et al. |

(Continued)

FOREIGN PATENT DOCUMENTS

| | | |
|---|---|---|
| CN | 1241298 A | 12/1997 |
| JP | 4-356972 | 12/1992 |

(Continued)

OTHER PUBLICATIONS

Bazer-Bachi et al., On the Hydrogen Passivatino of Highly Doped Emitters, 2009.*

(Continued)

*Primary Examiner* — Kenneth Parker
*Assistant Examiner* — Christopher Culbert
(74) *Attorney, Agent, or Firm* — Womble Bond Dickinson (US) LLP

(57) ABSTRACT

A passivation layer is deposited on a first portion of a region of the solar cell. A grid line is deposited on a second portion of the region. The passivation layer is annealed to drive chemical species from the passivation layer to deactivate an electrical activity of a dopant in the first portion of the region of the solar cell.

23 Claims, 12 Drawing Sheets

(56) References Cited

U.S. PATENT DOCUMENTS

| | | | |
|---|---|---|---|
| 7,687,334 B2 | 3/2010 | Zou et al. | |
| 7,927,937 B2 | 4/2011 | Zou et al. | |
| 2005/0189015 A1* | 9/2005 | Rohatgi | H01L 31/022425 |
| | | | 136/261 |
| 2006/0208257 A1 | 9/2006 | Branz et al. | |
| 2008/0076203 A1 | 3/2008 | Ribeyron et al. | |
| 2008/0290368 A1 | 11/2008 | Rubin | |
| 2009/0020156 A1 | 1/2009 | Ohtsuka et al. | |
| 2009/0126786 A1 | 5/2009 | Dominguez et al. | |
| 2009/0308439 A1 | 12/2009 | Adibi et al. | |
| 2010/0258172 A1 | 10/2010 | Straboni | |
| 2010/0263717 A1 | 10/2010 | Wang et al. | |
| 2011/0039034 A1 | 2/2011 | Maynard | |
| 2011/0081745 A1 | 4/2011 | Wu et al. | |
| 2011/0176353 A1* | 7/2011 | Li | B82Y 10/00 |
| | | | 365/148 |
| 2011/0308615 A1 | 12/2011 | Teplin et al. | |
| 2012/0125424 A1 | 5/2012 | Wenham et al. | |
| 2013/0048069 A1 | 2/2013 | Wang | |
| 2013/0160833 A1 | 6/2013 | Luscutoff et al. | |
| 2013/0199604 A1 | 8/2013 | Shumate et al. | |
| 2013/0340805 A1 | 12/2013 | Li et al. | |

FOREIGN PATENT DOCUMENTS

| | | |
|---|---|---|
| JP | 05-326938 | 12/1993 |
| JP | 06-13639 | 12/1994 |
| JP | 07194965 | 8/1995 |
| JP | 2003-273382 | 9/2003 |
| JP | 2004-228589 | 12/2004 |
| JP | 2006-344883 | 12/2006 |
| JP | 2008-78661 | 4/2008 |
| JP | 2011-524640 | 9/2011 |
| KR | 1020010049351 A | 6/2002 |
| KR | 10-2007-0106818 A | 11/2007 |
| TW | I265144 | 11/2006 |
| WO | WO98/28798 A | 7/1998 |
| WO | WO 2008-141415 A1 | 11/2008 |
| WO | WO 2009-152378 | 12/2009 |
| WO | WO 2011-156454 | 12/2011 |

OTHER PUBLICATIONS

Benjamin Gorka, Hydrogen Passivation of Polycrystalline Si Thin Film Solar Cells, 2010.*

Low, et al., "High Efficiency Selective Emitter Enabled Through Patterned Ion Implantation," IEEE, 2010, pp. 001440-001445.

Richardson, et al, "Hot-wire CVD-grown epitaxial Si films on Si (100) substrates and a model of epitaxial breakdown," Science Direct, Thin Solid Films 501, 2006, pp. 332-334.

Roder, et al., "Research: Short Communication: Accelerated Publication: Add-On Laser Tailored Selective Emitter Solar Cells," Progress in Photovoltaics: Research and Applications 2010, vol. 18, pp. 505-510.

Ruby, et al., "Recent Progress on the Self-Aligned, Selective-Emitter Silicon Solar Cell," 26$^{th}$ PVSC, Sep. 30-Oct. 3, 1997, Anaheim, CA, IEEE, pp. 39-42.

Rudolph, et al., Etch Back Selective Emitter Process With Single POCL$_3$ Diffusion, International Solar Energy Research Center, 2011, 4 pgs.

Schropp, "Present Status of Hot Wire Chemical Vapor Deposition Technology, 2003 MRS Spring Meeting MRS Proceedings," vol. 762, Symposium A—Amorphous and Nanocrystalline Silicon-Based Films, 2003, Published online by Cambridge University Press, Cambridge Journals online, p. 1.

Seager, et al., "Reversible Changes of the Charge State of Donor/Hydrogen Complexes Initiated by Hole Capture in Silicon", Applied Physics Letters 63, Jul. 3, 1993, pp. 1531-1533, Sandia National Laboratories, Albuquerque, New Mexico.

International Application No. PCT/US2013/024780, International Preliminary Report on Patentability (Chapter 1 of the Patent Cooperation Treaty), dated Aug. 12, 2014, 1 page.

International Application No. PCT/US2013/024780, Written Opinion of the International Searching Authority, dated Jun. 2, 2013, 8 pages.

Supplementary European Search Report and Annex to EESR on European Patent Application No. EP 13746046, Search Opinion for PCT/US2013/024780, dated Aug. 6, 2015, 10 pages.

Chatterjee, B. et al., "Hydrogen Passivation of $n^+p$ and $p^+n$ Heteroepitaxial InP Solar Cell Structures," XP 000688579, Progress in Photovoltaics Research and Applications vol. 4, 91-100 (1996) SPRAT XIV Conference, (revised Jan. 29, 1996) 10 pages.

Chung, B.C. et al., "15% efficiency (1 sun, air mass 1.5) large-area, 1.93 eV $Al_x$, $Ga_{1-x}$,As (x=0.37) n-p solar cell grown by metalorganic vapor phase epitaxy." XP-000816462, Appl. Phys. Lett..52(8) Feb. 22, 1988, 4 pages.

PCT International Search Report and Written Opinion for PCT/US2015/013104, dated Apr. 28, 2015, 12 pages.

G. Hahn, "Status of selective emitter technology," Proceedings of the Twenty-Fifth EU PVSEC, Valencia, Spain, 2010, 6 pages.

"Sunrise Global Solar reaches 19.2% cell efficiency," <http://www.solarbuzz.com/industry-news/sunrise-global-solar-reaches-192-cell-efficiency>, 2011, 2 pages.

"Suntech 235 Pluto Wdm Solar Panel," <http://www.civicsolar.com/product/suntech-235-pluto-wdm-solar-panel>, 2012.

H. Haverkamp and B. Tjahjono, "Selective emitter (SE) technology—the transfer from laboratory to optimization in full-scale production," Photovoltaics International, $16_{th}$ Edition, pp. 75-80, 2012.

C.T. Sah, J.Y.C. Sun, and J.J.T. Tzou, "Deactivation of the boron acceptor in silicon by hydrogen," Appl. Phys. Lett. vol. 43, No. 2, pp. 204-206, 1983, 4 pages.

C.P. Herrero, M. Stutzmann, and A. Breitschwerdt, "Boron-hydrogen complexes in crystalline silicon," Physical Review B, vol. 43, No. 2, pp. 1555-1575, 1991.

P.A. Basore, "CSG-1: Manufacturing a New Polycrystalline Silicon PV Technology", IEEE, 2006, pp. 2089-2093.

Y. Ohmura, Y. Otomo, Y. Tago, N. Terakado, and T. Satoh, "Enhanced hydrogenation and acceptor passivation in Si by pressurized water boiling," Applied Physics Letters, vol. 67, pp. 64-66, 1995.

J Benick, et al., "High efficiency n-type silicon solar cells with front side boron emitter," $24_{th}$ EU Photovoltaic Solar Energy Conference, 2009, 8 pages.

J.V. Sali, S.B. Patil, S.R. Jadkar, and M.G. Takwale, "Hot-wire CVD growth simulation for thickness uniformity," Thin Solid Films, vol. 395, pp. 66-70, 2001.

A. Das, K. Ryu, and A. Rohatgi, "20% efficient screen-printed n-type solar cells using a spin-on source and thermal oxide/silicon nitride passivation," IEEE Journal of Photovoltaics, vol. 1, No. 2, pp. 146-152, 2011.

S. Mehta, "Insight into First Solar's acquisition of Tetrasun," Greentech Media, http://www.greentechmedia.com/articles/read/Insight-Into-First-Solars-Acquisition-of-TetraSun, 2013, 4 pages.

B. Bazer-Bachi, E. Fourmond, and M. Lemiti, "On the hydrogen passivation of highly doped emitters," $24_{th}$ EUPVSEC, 2009, 4 pages.

A. Edler, V.D. Mihailetchi, C. Comparotto, L.J. Koduvelikulathu, R. Kopecek, R. Harney, T. Boescke, and J. Lossen, "On the metallization losses of bifacial n-type silicon solar cells," $27_{th}$ EUPVSEC, 2012, 3 pages.

S. Phang, W. Liang, B. Wopensinger, M. Kessler, and D. Macdonald, "Tradeoffs between impurity gettering, bulk degradation, and surface passivation of boron-rich layers on silicon solar cells," IEEE Journal of Photovoltaics, vol. 3, No. 1, pp. 261-266, 2013.

P. Altermatt, H. Plagwitz, R. Bock, J. Schmidt, R. Brendel, M.J. Kerr, and A. Cuevas, "The surface recombination velocity at boron-doped emitters: Comparison between various passivation techniques," $21_{st}$ EUPVSEC, Sep. 4-8, 2006, pp. 647-650.

B. Sopori et al., "A Comprehensive Model of Hydrogen Transport into a Solar Cell During Silicon Nitride Processing for Fire-Through Metallization", $31^{st}$ IEEE Photovoltaics Specialists, Feb. 2005, 7 pages.

(56) References Cited

OTHER PUBLICATIONS

Shih, et al., "Structural differences between deuterated and hydrogenated silicon nitride/oxynitride," J. Appl. Phys. vol. 89, No. 10, May 15, 2001, pp. 5355-5361.
Zhao, Yan and Donald G. Thruhlar, "Calculation of semiconductor band gaps with the M06-L density functional," American Institute of Physics 130, 07413, published online Feb. 18, 2009, 3 pages.
PCT International Preliminary Report on Patentability and Written Opinion for PCT Application No. PCT/US2015/013104 dated Aug. 25, 2016, 9 pages.

\* cited by examiner

SOLAR CELLS AND METHODS OF FABRICATION THEREOF

GOVERNMENT LICENSE RIGHTS

This invention was made with government support under Small Business Innovation Research Grant Award No. IIP-1047296 awarded by National Science Foundation and SunShot Incubator Award No. EE0006461 awarded by Department of Energy. The government has certain rights in the invention.

TECHNICAL FIELD

Embodiments of the present invention are related to the field of renewable energy and, in particular, to solar cells and methods of fabrication thereof.

BACKGROUND

Generally, solar cells are known as devices that convert solar radiation into electrical energy. Typically, solar cells are fabricated on a semiconductor substrate using semiconductor processing techniques to form a p-n junction near a surface of the substrate. Solar radiation incident upon the surface of the substrate creates electron and hole pairs in the bulk of the substrate. The electron and hole pairs migrate to p-doped and n-doped regions in the substrate, thereby generating a voltage differential between the doped regions. The doped regions are coupled to metal contacts on the solar cell to direct an electrical current from the cell to an external circuit coupled thereto. Radiation conversion efficiency is an important characteristic of a solar cell as it is directly related to the solar cell's capability to generate electrical power.

FIG. 1 is an illustration of a cross-sectional view of a typical homogeneous emitter solar cell structure 100. As shown in FIG. 1, a highly doped $p^+$-type silicon emitter 102 is formed on n-type silicon substrate 101. Metal grid lines, such as a metal grid line 104 are formed on the emitter 102. An antireflective coating ("AR") 103 is deposited on the portion of the emitter 102 between the grid lines. The conventional homogeneous emitter, such as emitter 102, has uniform doping profile underneath and between grid contacts. The active dopant concentration at the surface of the homogeneously doped emitter is generally at least $10^{20}$ cm$^{-3}$ to form an ohmic contact with the grid line and to obtain a high fill factor which is typically defined as a ratio of the actual maximum obtainable power to the product of the open circuit voltage and short circuit current.

High concentration of the active dopants at the surface of the emitter creates high surface recombination velocities. High surface recombination velocity limits open-circuit voltage (Voc) and short-circuit current (Jsc) directly limiting the conversion efficiency of the solar cell.

A selective emitter is used to avoid the limitations caused by the homogeneous emitter. Selective emitters have high dopant concentration beneath grid lines and low dopant concentration between the grid lines. The conventional selective emitter techniques require two or more processing steps to achieve this.

One selective emitter technique starts with the lightly doped Si emitter. Then highly doped silicon paste is selectively applied through a mask to the regions of the lightly doped Si emitter where the grid lines are going to be placed. Then, the grid lines are formed on the highly doped silicon paste regions.

Another selective emitter technique starts with highly doped Si emitter. A hard mask is deposited on the highly doped emitter. The portions of the highly doped Si emitter are etched back through a hard mask to reduce doping in those portions of the Si emitter that are between the grid lines. The grid lines are then deposited on the un-etched highly doped regions of the emitter.

Another selective emitter technique uses at least two separate steps of ion implantation to produce high doping of the emitter underneath the grid lines and low doping of the emitter between the grid lines.

All conventional selective emitter techniques require complicated alignment processing and have generally low throughput. The surface doping achieved with these techniques provides high sheet resistances that are more than 100 Ω/sq. Such high sheet resistances cause a lot of power loss, so that conventional selective emitters require up to 50% more grid lines than the homogeneous emitter. Because the grid metallization typically contains silver, this is a very expensive requirement.

SUMMARY OF THE DESCRIPTION

Figure 1:
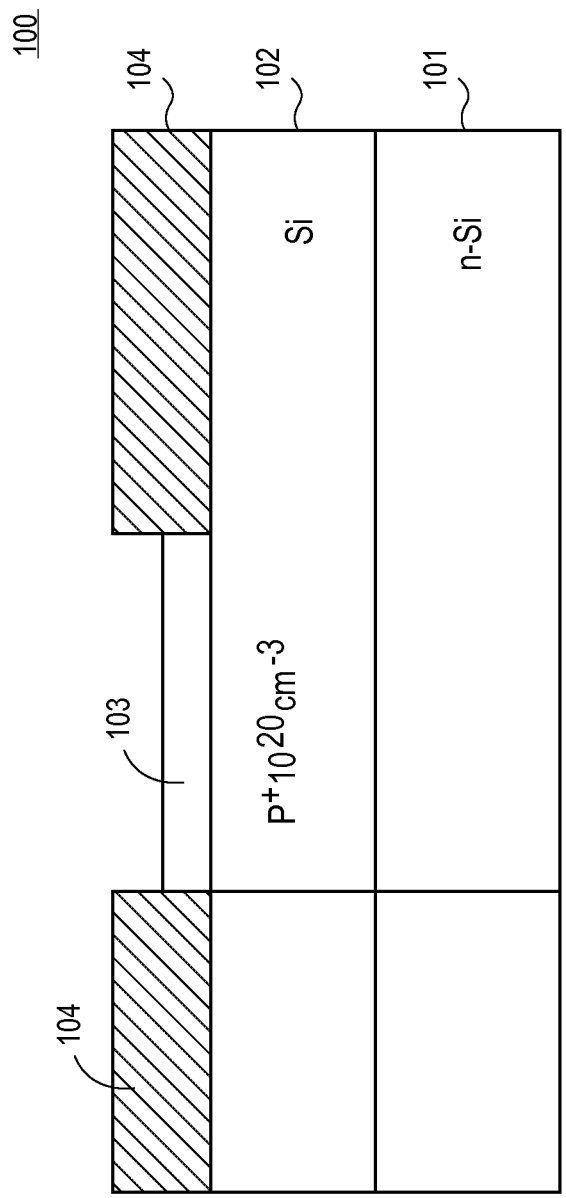
FIG. 1 is an illustration of a cross-sectional view of a typical homogeneous emitter solar cell structure.

Exemplary embodiments of methods and apparatuses to manufacture solar cells are described. In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. In an embodiment, the chemical species are prevented from reaching the second portion in sufficient quantities to significantly alter the active doping concentration.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The electrical activity of the dopant in the first portion is deactivated by reacting the dopant with the chemical species from the passivation layer to form an electrically inactive complex.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The passivation layer is silicon nitride, silicon oxide, aluminum oxide, one or more spin-on glasses, or any combination thereof, and wherein the chemical species comprises atomic hydrogen, deuterium, lithium, copper, or any combination thereof.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The passivation layer comprises $Si_xH_yN_z$, wherein y is from about 1% to about 70% by weight. In an embodiment, the passivation layer comprises any combination of silicon, nitrogen, oxygen, and hydrogen.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The first temperature is adjusted to generate a dopant profile having a concentration of active dopants at a surface portion of the first portion smaller than the concentration of active dopants at a distance away from the surface portion.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. A bias voltage (e.g., a steady-state voltage, a pulsed biasing, or both) is applied to the solar cell to control deactivating of the electrical activity of the dopant in the first portion of the region of the solar cell. In an embodiment, the bias voltage applied to the solar cell is adjusted to control the penetration depth of the chemical species into the passivation layer, the first portion of the region of the solar cell, or both. In an embodiment, a temperature, a concentration of the chemical species, or both are adjusted to control deactivating of the elecrtrical activity of the dopant in the first portion of the region of the solar cell.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The first temperature is from about 85 degree C. to about 400 degree C. In an embodiment, the first temperature is from about −100 degree C. to about +1000 degree C. In an embodiment, the passivation layer is annealed at a first temperature for a first period of time to drive the chemical species into the first portion of the region of the solar cell. In an embodiment, the passivation layer is annealed at a first temperature for a second period of time to deactivate an electrical activity of a dopant in the first portion of the region of the solar cell. In an embodiment, the first temperature at the first period of time is higher than the first temperature at the second period of time. In an embodiment, the first period of time is shorter than the second period of time. In an embodiment, the first temperature at a first period of time is lower than the first temperature at a second period of time. In an embodiment, the first period of time is longer than the second period of time.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The thickness of the passivation layer is from about 1 nanometers ("nm") to about 500 nm.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The grid line is annealed at a second temperature higher than the first temperature to form an electrical contact on the second portion.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. In an embodiment, the region is an emitter formed on a solar cell substrate.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. In an embodiment, the region is a back surface field of the solar cell.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. In an embodiment, the passivation layer acts as an antireflective coating.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The dopant in the second portion of the region of the solar cell is kept electrically active. The region of the solar cell has a p-type conductivity.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The dopant in the second portion of the region of the solar cell is kept electrically active. The region of the solar cell has an n-type conductivity.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The dopant in the second portion of the region of the solar cell is kept electrically active. The grid line is conductive.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The dopant in the second portion of the region of the solar cell is kept electrically active. A time of the annealing of the passivation layer, a temperature of the annealing of the passivation layer, or both are adjusted to control deactivating the electrical activity of the dopant in the first portion of the region of the solar cell.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The dopant in the second portion of the region of the solar cell is kept electrically active. The dopant is at least one of boron (B), aluminum (Al), gallium (Ga), indium (In), thallium (Tl). In an embodiment, the dopant is hydrogen.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The dopant in the second portion of the region of the solar cell is kept electrically active. The dopant is at least one of nitrogen (N), phosphorus (P), arsenic (As), antimony (Sb), and bismuth (Bi). In an embodiment, the dopant is hydrogen.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The dopant in the second portion of the region of the solar cell is kept electrically active. The passivation layer is deposited on the grid line that acts as a mask to prevent the chemical species from deactivating the dopant in the second portion.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. The dopant in the second portion of the region of the solar cell is kept electrically active. The grid line is deposited on the second portion of the region by screen printing that comprises placing a metal paste containing an etchant over a passivation layer on the second portion of the region of the solar cell; and etching through the passivation layer down to the region by the etchant to place the metal paste into a direct contact with the second portion of region.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. Annealing of the grid line is performed at a temperature higher than the temperature of annealing of the passivation layer.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The electrical activity of the dopant in the first portion is deactivated by reacting the dopant with the chemical species from the passivation layer to form an electrically inactive complex.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The passivation layer comprises silicon nitride, silicon oxide, aluminum oxide, one or more spin-on glasses, or any combination thereof, and wherein the chemical species comprises hydrogen, deuterium, lithium, copper, or any combination thereof. In an embodiment, the passivation layer is a surface passivation layer, a field effect passivation layer, an anti-reflective layer, or any combination thereof.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. A dopant profile having a concentration of active dopants at a surface portion of the first portion smaller than the concentration of active dopants at a distance away from the surface portion.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. A bias voltage is applied to the solar cell to control deactivating of the electrical activity of the dopant in the first portion. In more specific embodiment, a bias voltage is applied across the solar cell to control deactivating of the electrical activity of the dopant in the first portion.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The thickness of the passivation layer is from about 1 nanometer to about 500 nanometers.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The region is an emitter formed on a solar cell substrate.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The region is a back surface field of the solar cell.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The region has a p-type conductivity.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The region has an n-type conductivity.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The time of the annealing of the passivation layer, a temperature of the annealing of the passivation layer, or both are adjusted to control deactivating of the electrical activity of the dopant in the first portion. In an embodiment, a concentration of the chemical species in the passivation layer, a concentration of the chemical species in the anti-reflective coating, a concentration of the chemical species the first portion of the region of the solar cell, or a combination thereof is adjusted to control deactivating of the electrical activity of the dopant in the first portion.

In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The dopant is at least one of boron (B), aluminum (Al), gallium (Ga), indium (In), thallium (Tl). In an embodiment, the dopant is hydrogen In an embodiment, a passivation layer is deposited on a region of the solar cell. The region of the solar cell comprises a first portion and a second portion. A grid line is deposited over the second portion. The grid line is annealed to form an electrical contact on the second portion. The passivation layer is annealed to drive chemical species from the passivation layer to deactivate an electrical activity of a dopant in the first portion. The electrical activity of the dopant in the second portion is substantially prevented from being deactivated. The dopant is at least one of nitrogen (N), phosphorus (P), arsenic (As), antimony (Sb), and bismuth (Bi). In an embodiment, the dopant is hydrogen In an embodiment, chemical species are supplied to a first portion of a region of a solar cell placed in a chamber. A passivation layer is deposited on the first portion of the region of the solar cell. A grid line is deposited over the second portion of the region. An electrical activity of a dopant in the first portion of the region of the solar cell is deactivated by exposure to chemical species using the grid line as a mask. The dopant in the second portion of the region of the solar cell is kept electrically active. Atomic elements are generated from the chemical species. The dopant in the first portion of the region is exposed to the atomic elements. A bias voltage is applied to the solar cell to control deactivating of the electrical activity of the dopant in the first portion of the region of the solar cell.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The part of the first dopant is bound to chemical species from the passivation layer and is electrically inactive.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The passivation layer is silicon nitride, silicon oxide, aluminum oxide, spin-on glass, or any combination thereof, and wherein the chemical species comprises atomic hydrogen, deuterium, lithium, copper, or any combination thereof.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The passivation layer comprises $Si_xH_yN_z$, where y is from about 1% to about 70% by weight.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The region is a selective emitter formed on a solar cell substrate.

In an embodiment, a solar cell comprises a first region formed on substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The region is a back surface field of the solar cell.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. An electrically active first dopant concentration at a surface portion of the first portion is smaller than the electrically active first dopant concentration at a distance away from the surface portion.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. An antireflective coating is deposited over the passivation layer.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The first dopant is electrically active in the first portion of the first region beneath the grid line.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The region is a p-type region.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The region is an n-type region.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The grid line forms an ohmic like contact with the second region.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The substrate comprises a monocrystalline silicon a polycrystalline silicon, or any combination thereof.

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The first dopant is at least one of boron (B), aluminum (Al), gallium (Ga), indium (In), and thallium (Tl).

In an embodiment, a solar cell comprises a first region formed on a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The first dopant is at least one of nitrogen (N), phosphorus (P), arsenic (As), antimony (Sb), and bismuth (Bi).

In an embodiment, a solar cell comprises a first region formed on a first side of a substrate, the first region comprising a first portion and a second portion. A first grid line is deposited on the second portion. A passivation layer is deposited on the first portion and the first grid line. An electrical activity of a part of the first dopant is deactivated in the first portion of the region of the solar cell. The solar cell comprises a second region having a second dopant on a second side of the substrate; and a second grid line adjacent to the second region. A passivation layer is deposited on the second grid line. An electrical activity of a part of the second dopant is deactivated in a portion of the second region of the solar cell outside the second grid line.

Other features of the embodiments of the invention will be apparent from the accompanying drawings and from the detailed description which follows.

DETAILED DESCRIPTION

Methods and apparatuses to manufacture solar cells are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as semiconductor deposition techniques are not described in detail in order to not unnecessarily obscure embodiments of the present invention. Furthermore, it is to be understood that the various embodiments shown in the Figures are illustrative representations and are not necessarily drawn to scale.

In an embodiment, a passivation layer is deposited on a first portion of a region of the solar cell. A grid line is deposited on a second portion of the region. The passivation layer is annealed at a first temperature to drive chemical species from the passivation layer to deactivate an electrical activity of a dopant in the first portion of the region of the solar cell. In an embodiment, the chemical species are prevented from reaching the second portion in sufficient quantities to significantly alter the active doping concentration. Thermal treatment of the passivation layer to drive chemical species from the passivation layer provides an advantage of in situ deactivation of an electrical activity of a dopant in a portion of the region of the solar cell without a need for a separate deactivation operation thereby reducing a number of manufacturing operations, and manufacturing cost.

In an embodiment, deactivation of an electrical activity of a dopant in a portion of the region of the solar cell as described herein involves a one step, self-aligned process that requires few consumables, and achieves an electrically active dopant concentration at a surface portion of the selective emitter between the grid lines as low as possible. In at least some embodiments, the selective emitter solar cell fabricated using processes as described herein has only marginally increased sheet resistance and requires the same or fewer grid lines as homogeneous emitter solar cells.

Figure 2:
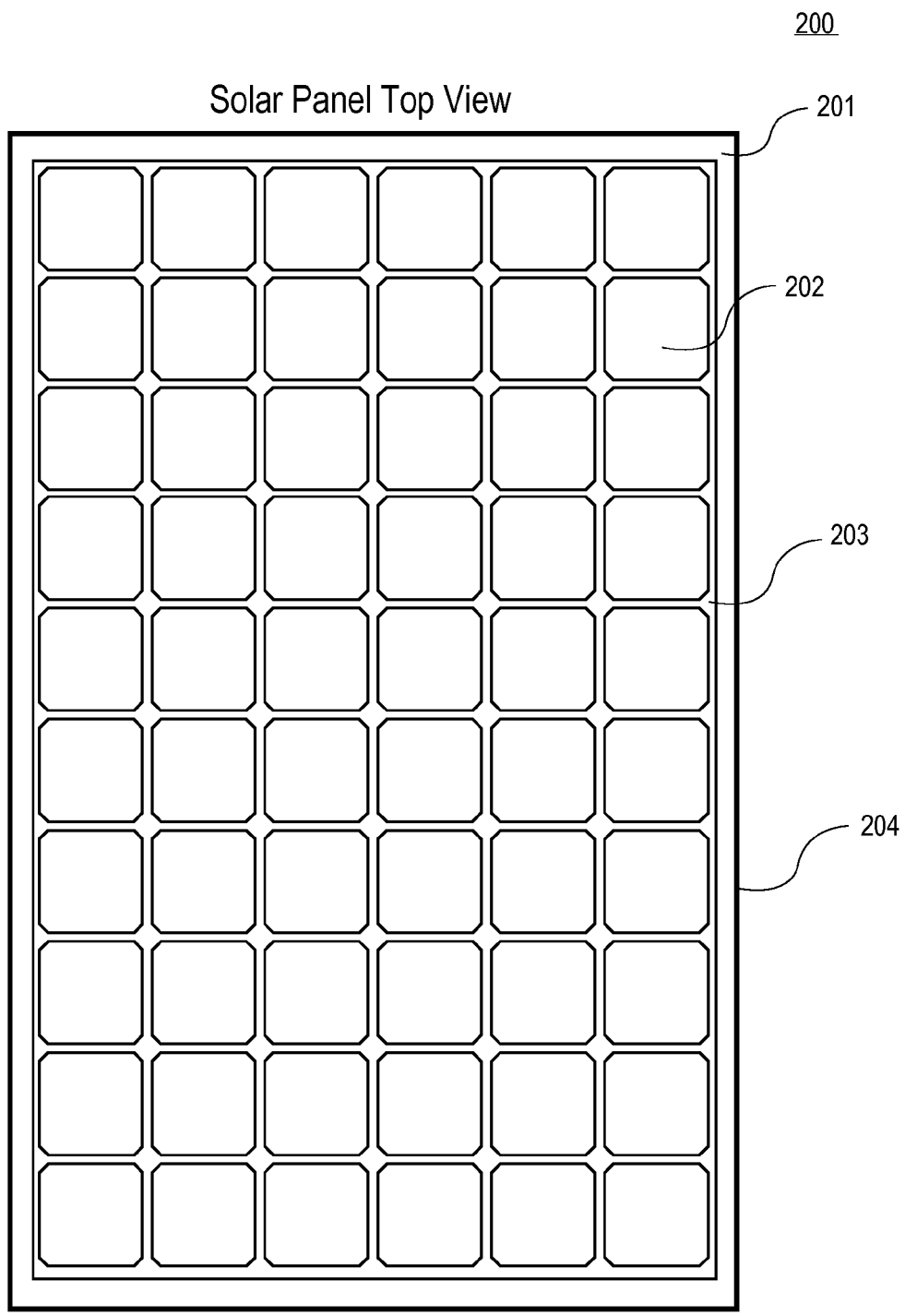
FIG. 2 is an illustration of a solar cell panel top view according to one embodiment of the invention.

FIG. 2 is an illustration of a solar cell panel top view according to one embodiment of the invention. A solar cell panel 200 has a frame 201 that holds solar cells, such as a solar cell 202. In an embodiment, the solar cell has grid lines and at least one of a selective emitter and a back surface field (not shown) fabricated using processes as described herein. In an embodiment, the solar cell is formed on a semiconductor wafer or substrate which is a thin slice of semiconductor material, e.g., silicon, or other semiconductor material. In one embodiment, the wafer serves as the substrate for the solar cell built in and over the wafer.

In an embodiment, the solar cell is an n-type solar cell having a self-aligned p-type selective emitter as described in further detail below. In an embodiment, the solar cell is a p-type bifacial solar cell having an n-type selective emitter and a self-aligned p-type back surface field to absorb light from both sides as described in further detail below.

The solar cells, such as solar cell 202 are mounted between a front glass sheet 203 and a back sheet 204. In one embodiment, the frame 201 is an aluminum frame, titanium frame, or other metal frame. In one embodiment, the back sheet is a plastic sheet, a metal sheet, or a combination thereof. In one embodiment, the back sheet is a glass sheet. In an embodiment, solar cells of the solar cell panel are electrically connected to each other to produce a desired voltage. The front glass sheet is typically made of a tempered glass to allow light to pass while protecting the semiconductor wafers from abrasion and impact due to e.g., wind-driven debris, rain, hail, etc. In an embodiment, solar cells are connected in series to create an additive voltage. In an embodiment, the front of one solar cell is connected in series to a back of the adjacent cell by a wire, a wire ribbon, or both. In an embodiment, strings of cells connected in series are handled independently. In an embodiment, solar cells are connected in parallel to yield a high current. In an embodiment, to make practical use of the solar-generated energy, the electricity is fed into an electricity grid using inverters (grid-connected photovoltaic systems). In a stand-alone system, a battery is used to store the energy that is not needed immediately. Solar panels can be used to power or recharge portable devices. In an embodiment, the solar cells in the panel are electrically interconnected by flat wires, metal ribbons, or both.

Figure 3:
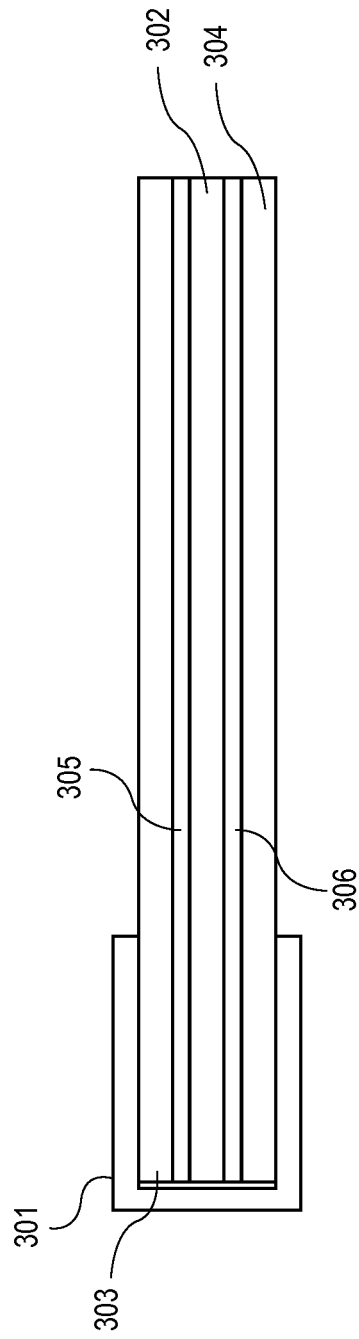
FIG. 3 is an illustration of a cross-sectional view of a portion of a solar cell panel according to one embodiment of the invention.

FIG. 3 is an illustration of a cross-sectional view 300 of a portion of a solar cell panel 300 according to one embodiment of the invention. In an embodiment, the view 300 illustrates a portion of the panel 200 as depicted in FIG. 2. As shown in FIG. 3, a metal frame 301 embraces a stack comprising a solar cell 302 placed between a front glass sheet 303 and a back sheet 304. In an embodiment, the solar cell has grid lines and at least one of a selective emitter and a back surface field (not shown) fabricated using processes as described herein. An encapsulant 305 is placed between the front surface of the solar cell 302 and front glass sheet 303. An encapsulant 306 is placed between back surface of the solar cell 302 and back sheet 304. In an embodiment, each of the encapsulants 305 and 306 is a polymer encapsulant.

Figure 4:
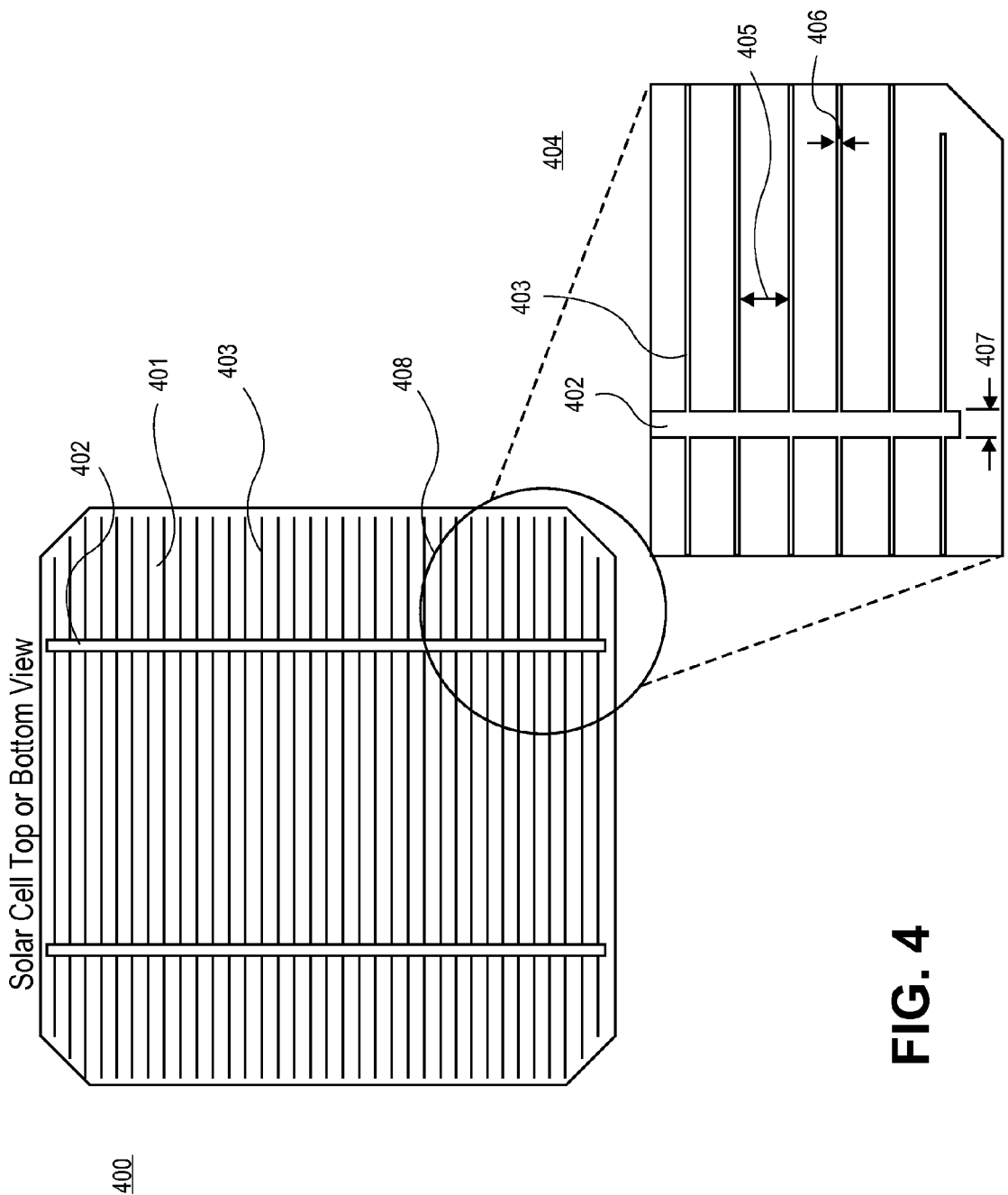
FIG. 4 is an illustration of a view of a solar cell having grid lines according to one embodiment of the invention.

FIG. 4 is an illustration of a view of a solar cell 400 having grid lines according to one embodiment of the invention. The solar cell can be one of the solar cells 202 and 320 as depicted in FIGS. 2 and 3. In one embodiment, the view 400 is a top view of the solar cell. In one embodiment, view 400 is a bottom view of the solar cell. The solar cell has grid lines, such as a grid line 403, and bus bars, such as a bus bar 402 formed on the surface of the solar cell substrate 401. A view 404 is an enlarged view of a portion 408 of the solar cell. In one embodiment, the grid lines and bus bars are conductive lines comprising silver, copper, other metal, any other electrically conductive material, or a combination thereof.

The grid lines are used to collect current, voltage, or both from portions of a solar cell. The grid lines are connected to a bus bar. The bus bar is typically used to collect current, voltage, or both from multiple solar cells. In an embodiment, the spacing 405 between the grid lines is greater than about 1.8 millimeters ("mm"). In one embodiment, the spacing between the grid lines is from about 1.5 mm to about 25 mm. In more specific embodiment, the spacing between the grid lines is about 1.9 mm. In an embodiment, the width 406 of the grid line is from about 80 microns ("μm") to about 100 μm. In an embodiment, the width 407 of the bus bar is from about 1.5 mm to about 4 mm. In more specific embodiment, the width 407 of the bus bar is about 2 millimeters. In an embodiment, a 6-inch solar cell semiconductor substrate or wafer has from about 80 to about 90 grid lines formed thereon. In an embodiment, a density of the grid lines over the solar cell substrate is not more than about 13 grid lines per inch. In other embodiment, a density of the grid lines over the solar cell substrate is less than about 10 grid lines per inch. In an embodiment, the solar cell substrate is a semiconductor, for example, monocrystalline silicon, polycrystalline silicon, amorphous silicon, cadmium telluride, copper indium selenide/sulfide, gallium arsenide, other semiconductor, or a combination thereof. In an embodiment, the solar cell substrate includes a thin film, e.g., amorphous silicon, cadmium telluride, copper indium gallium selenide, gallium arsenide, or other semiconductor thin film deposited on a supporting substrate. In one embodiment, the solar cell substrate is fabricated at least in part using a top-down aluminum induced crystallization (TAIC). In an embodiment, the solar cell substrate includes an organic material, e.g., dye, a polymer, or a combination thereof.

In an embodiment, the fine conductive grid lines and wider bus bars are screen-printed onto the surface of the semiconductor substrate using a metal paste. In one embodiment, metal paste includes silver, copper paste, other metal, other electrically conductive material, or a combination thereof. In one embodiment, the metal paste is a silver paste. In one embodiment, the solar cell substrate has a grid pattern contact on the front side and on the back side. In one embodiment, the solar cell substrate has a grid pattern on the front side and a full area metal contact on the back surface (not shown). The full area metal contact typically covers the entire rear side of the substrate. In an embodiment, the full area rear contact is formed by screen-printing a metal paste, e.g., aluminum. Typically, the paste is then annealed at several hundred degrees Celsius to form metal electrodes in ohmic like contact with the silicon. After the metal contacts are made, the solar cells are interconnected by flat wires or metal ribbons, and assembled into modules or solar panels, such as a solar cell panel depicted in FIG. 2.

The conductive grid lines and bus bars may be deposited over the solar cell substrate using one of conductive line deposition techniques known to one of ordinary skill in the art of electronic device manufacturing.

Figure 5A:
FIG. 5A is a cross-sectional view of a portion of a solar cell in a partially fabricated state according to one embodiment of the invention.

FIG. 5A is a cross-sectional view of a portion of a solar cell in a partially fabricated state according to one embodiment of the invention. A view 500 can represent one of the solar cells depicted in FIGS. 2-4. A view 500 can represent a portion 410 of the solar cell along an axis A-A depicted in FIG. 4. A doped region 502 is formed on a substrate 501. Typically, a type of the solar cell is defined by the type of the substrate ("base"). In an embodiment, the substrate 501 is a semiconductor substrate, for example, monocrystalline silicon, polycrystalline silicon, amorphous silicon, cadmium telluride, copper indium selenide/sulfide, gallium arsenide, other semiconductor, or any combination thereof.

Region 502 has a dopant. The dopant is represented by a plurality of electrically active dopant particles, such as a dopant particle 508. Depending on embodiment, the electrically active dopant particle is an electron, hole, atom, ion, or any other electrically active particle of the dopant. In one embodiment, the thickness of the region 502 is from about 0.001 μm to about 2 μm. In one embodiment, the doped region 502 has a p-type conductivity. In one embodiment, the doped region 502 has an n-type conductivity. In one embodiment, the dopant of the doped region 502 is at least one of boron (B), aluminum (Al), gallium (Ga), indium (In), thallium (Tl), and other acceptor dopant. In one embodiment, the dopant of the doped region 502 is at least one of nitrogen (N), phosphorus (P), arsenic (As), antimony (Sb), bismuth (Bi) and other donor dopant. In an embodiment, the dopant of the doped region 502 is hydrogen that acts as a substitutional dopant.

In one embodiment, the doped region 502 is a selective emitter of the solar cell. In an embodiment, the doped region 502 has a conductivity type that is different from that of the substrate 501. For example, if the substrate has an n-type conductivity, the doped region has a p-type conductivity. If the substrate has a p-type conductivity, the doped region has an n-type conductivity. In an embodiment, the base region is an n-type silicon substrate and the doped region has a p-type dopant, e.g., boron (B), aluminum (Al), gallium (Ga), indium (In), thallium (Tl), other acceptor dopant, or a combination thereof to provide a p-type conductivity. In an embodiment, the base region is a p-type silicon substrate, and the doped region has an n-type dopant, e.g., nitrogen (N), phosphorus (P), arsenic (As), antimony (Sb), bismuth (Bi), other donor dopant, or a combination thereof to provide n-type conductivity. In one embodiment, the doped region is a p$^+$-type region having an acceptor dopant concentration of at least about $10^{19}$ cm$^{-3}$. In one embodiment, the doped region is an n$^+$-type region having a donor dopant concentration of at least about $10^{19}$ cm$^{-3}$. In an embodiment, the doped region comprises a phosphosilicate glass ("PSG"), a borosilicate glass ("BSG"), or any combination thereof. In an embodiment, a PSG, a BSG, or any combination thereof are formed as a result of diffusion on the surface of the doped region that act as a passivation layer that is removed later on in a process.

In one embodiment, the doped region 502 is a back surface field of the solar cell. In an embodiment, the doped region has the same conductivity type as the substrate. For example, if the substrate has a p-type conductivity, the doped region has a p-type conductivity. In an embodiment, the doped region on the p-type silicon substrate has a p-type dopant, e.g., boron (B), aluminum (Al), gallium (Ga), indium (In), thallium (Tl), other acceptor dopant, or a combination thereof to provide a p-type conductivity. If the substrate has an n-type conductivity, the doped region has an n-type conductivity. In an embodiment, the doped region on the n-type silicon substrate has an n-type dopant, e.g., nitrogen (N), phosphorus (P), arsenic (As), antimony (Sb), bismuth (Bi), other donor dopant, or a combination thereof to provide n-type conductivity.

In an embodiment, the doped region is formed by introducing the dopant into the substrate by diffusion, ion implantation, or any other techniques known to one of ordinary skill in the art of the electronic device manufacturing. In an embodiment, the doped region is formed by one of epitaxial techniques known to one of ordinary skill in the art of electronic device manufacturing.

Figure 5B:
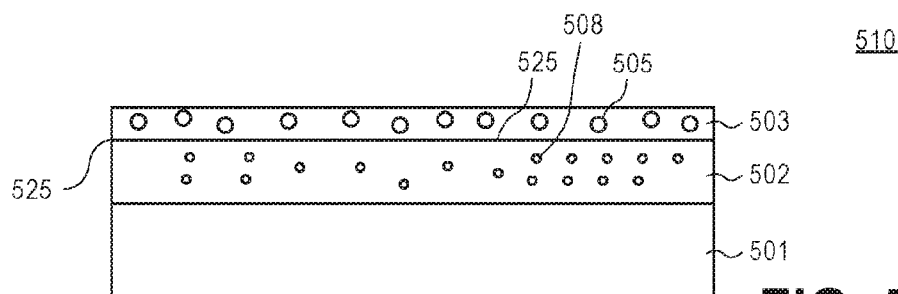
FIG. 5B is a view similar to FIG. 5A, after a passivation layer is deposited on a doped region of the solar cell according to one embodiment of the invention.

FIG. 5B is a view 510 similar to FIG. 5A, after a passivation layer is deposited on a doped region of the solar cell according to one embodiment of the invention. A passivation layer 503 is deposited on the doped region 502 to reduce amount of the surface traps for carriers (electrons and/or holes). In an embodiment, passivation layer is deposited to deactivate a portion of the dopant in a portion of the doped region 502, as described in further detail below. Passivation layer 503 comprises chemical species, such as a chemical species 505 to react with dopant particles of the dopant region 502 to form electrically inactive complexes, as described in further detail below. In an embodiment, chemical species 505 are formed at an interface 525 between passivation layer 503 and doped region 502. In an embodiment, chemical species 505 comprises atomic elements and diatomic elements (e.g., atomic hydrogen, deuterium, lithium, copper, or other atomic elements).

In an embodiment, the passivation layer containing chemical species 505 is hydrogen rich silicon nitride. In an embodiment, the passivation layer containing chemical species 505 is hydrogen rich silicon oxide. In an embodiment, the passivation layer containing chemical species 505 is hydrogen rich aluminum oxide. In an embodiment, the passivation layer containing chemical species 505 comprises silicon nitride, silicon oxide, aluminum oxide, or any combination thereof. In an embodiment, the passivation layer comprises $Si_xH_yN_z$, where y is from about 1% to about 70% by weight. In an embodiment, the passivation layer comprises any combination of silicon, nitrogen, oxygen, and hydrogen. In an embodiment, the hydrogen containing chemical species are formed at the interface 525 from the silicon nitride processing. In an embodiment, hydrogen chemical species are formed at interface 525 from a chemical reaction between silane and ammonia before the silicon nitride deposition. In an embodiment, deposition of the passivation layer of silicon nitride onto the doped region of silicon introduces hydrogen into the doped region of silicon and into the passivation layer of silicon nitride. In an embodiment, deposition of the passivation layer of silicon nitride onto the doped region of silicon introduces more hydrogen into the passivation layer of silicon nitride than into the doped region of silicon. In an embodiment, a bias voltage (e.g., a steady-state voltage, a pulsed biasing, or both), is applied across doped region 502 on substrate 501 to simultaneously deposit passivation layer 503 and to introduce chemical species 505 onto doped region 502. In an embodiment, a portion of the dopant particles 508 is deactivated by the chemical species introduced during a bias voltage deposition of the passivation layer, as described in further detail below with respect to FIGS. 8 and 9.

In an embodiment, the thickness of the passivation layer is from about 1 nm to about 500 nm. In an embodiment, the thickness of the passivation layer 503 is from about 20 nm to about 100 nm. In one embodiment, the thickness of the passivation layer 503 is from about 10 nanometers ("nm") to about 200 nm. In more specific embodiment, the thickness of the passivation layer 503 is from about 70 nm to about 100 nm. In an embodiment, the passivation layer 503 includes a silicon nitride anti-reflective coating layer on a silicon dioxide passivation layer. The thickness of the underlying silicon dioxide layer smaller than that of the silicon dioxide layer, so that the silicon dioxide layer does not interfere with optical properties of the anti-reflective coating layer about it. In an embodiment, the thickness of the silicon nitride anti-reflective coating layer is about 70 nm, and the thickness of the underlying silicon dioxide layer is from about 10 nm to about 20 nm.

In an embodiment, prior forming the passivation layer, the doped region on the silicon substrate having a (100) crystalline plane orientation, is etched predominantly along a (111) crystalline plane orientation to form pyramids (not shown) to trap the incident light. In one embodiment, the height of the pyramids on the surface of the doped region 502 is about 10 microns. In an embodiment, the doped region is etched using one of wet or dry etching techniques known to one of ordinary sill in the art of electronic device manufacturing. In an embodiment, the doped region is wet etched using hydrofluoric acid.

In an embodiment, a silicon nitride containing hydrogen passivation layer is deposited on the pyramids formed on the surface of the doped silicon region. In one embodiment, the passivation layer is deposited at a temperature less than about 400 degree C. In more specific embodiment, the passivation layer is deposited at a temperature from about 160 degree C. to about 240 degree C. In an embodiment, the passivation layer is deposited onto the doped region using a plasma-enhanced chemical vapor deposition (PECVD) technique, or one of other passivation layer deposition techniques known to one of ordinary skill in the art of electronic device manufacturing.

In an embodiment, an anti-reflective ("AR") coating (not shown) is deposited on the passivation layer to reduce light loss due to reflection and to direct the light into the solar cell. In an embodiment, the AR coating is a multilayer coating. In an embodiment, the passivation layer 503 acts as an AR coating. In one embodiment, the thickness of the AR coating is from about 1 nm to about 200 nm. In one embodiment, the thickness of the AR coating is less than about 100 nm. In one embodiment, the thickness of the AR coating is from about 20 nm to about 100 nm. In one embodiment, the total thickness of both the passivation layer and the AR coating is from about 10 nm to about 400 nm. In one embodiment, the AR coating is deposited using a plasma-enhanced chemical vapor deposition (PECVD) technique, or one of other AR coating deposition techniques that are known to one of ordinary skill in the art of electronic device manufacturing.

Figure 5C:
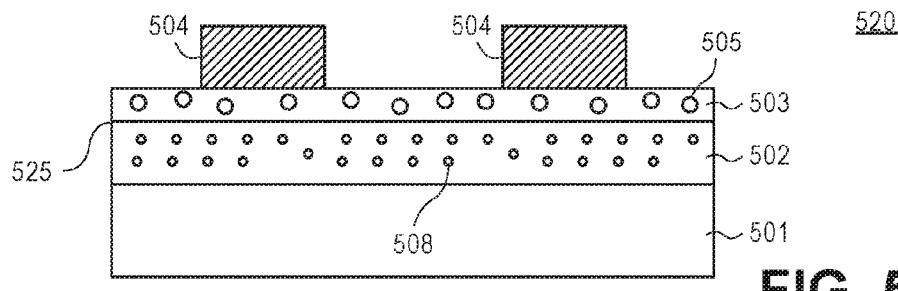
FIG. 5C is a view similar to FIG. 5B, after grid lines are deposited on a portion of a doped region of the solar cell according to one embodiment of the invention.

FIG. 5C is a view 520 similar to FIG. 5B, after grid lines 504 are deposited on a portion of a doped region of the solar cell according to one embodiment of the invention. In an embodiment, the thickness of the grid lines 504 is from about 5 μm to about 200 μm. In an embodiment, the thickness of the grid lines is from about 5 μm to about 45

μm. In an embodiment, the grid line is at least four times thicker than the AR coating and/or passivation layer.

In an embodiment, the grid lines are deposited onto portions of the doped region by screen printing a metal paste containing an etchant onto the AR layer, passivation layer, or both. The etchant in the metal paste etches through the AR layer, passivation layer, or both down to the doped region so that the metal paste is placed in direct contact with the doped region. In an embodiment, the metal paste containing an etchant is silver, aluminum, or any other metal paste known to one of ordinary skill in the art of electronic device manufacturing.

Figure 5D:
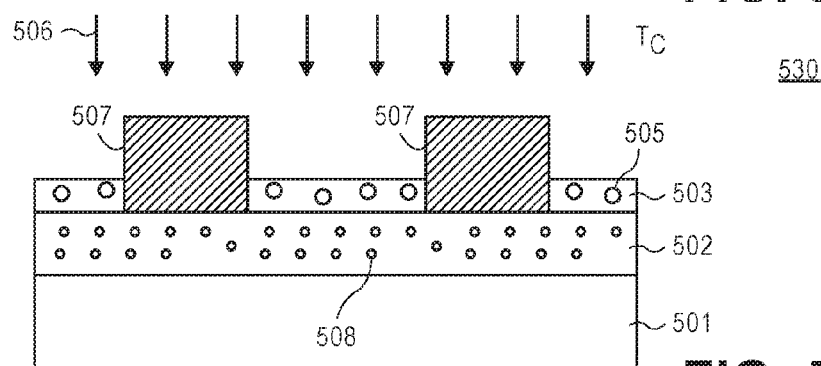
FIG. 5D is a view similar to FIG. 5C illustrating annealing of the grid lines according to one embodiment of the invention.

FIG. 5D is a view 530 similar to FIG. 5C illustrating annealing of the grid lines to form ohmic like contacts with portions of the doped region of the solar cell according to one embodiment of the invention. As shown in FIG. 5D, the grid lines 504 are annealed 506 at a temperature Tc to etch through passivation layer 503 to form ohmic like grid line contacts 507. As shown in FIG. 5D, at temperature Tc chemical species 505 are moved outside the grid line contacts 507. In an embodiment, the temperature Tc is substantially higher than 300 degree C. In an embodiment, the temperature Tc is from about 700 degree C. to about 900 degree C. In more specific embodiment, the temperature Tc is about 800 degree C. In one embodiment, the silver paste screen printed onto the doped region of the silicon solar cell substrate is heated to at least 700° C. to etch through the AR layer, passivation layer, or both down to the doped silicon region.

Figure 5E:
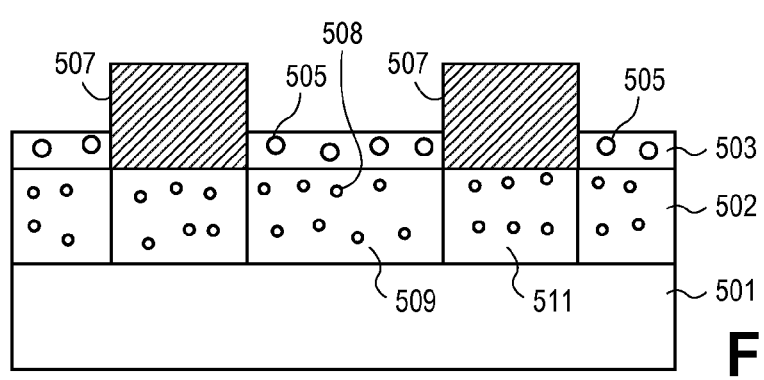
FIG. 5E is a view similar to FIG. 5D, after grid line contacts are formed on portions of the doped region according to one embodiment of the invention.

FIG. 5E is a view 540 similar to FIG. 5D, after ohmic like grid line contacts are formed on portions of the doped region according to one embodiment. As shown in FIG. 5E, region 502 has portions that are not covered by the grid line contacts, such as a portion 509 and portions that are covered by grid line contacts, such as a portion 511. As shown in FIG. 5E, the active dopant particles are distributed substantially uniformly in region 602 that includes the portions beneath the grid line contacts 507, such as portion 511 and the portions outside the grid line contacts, such as portion 509.

Figure 5F:
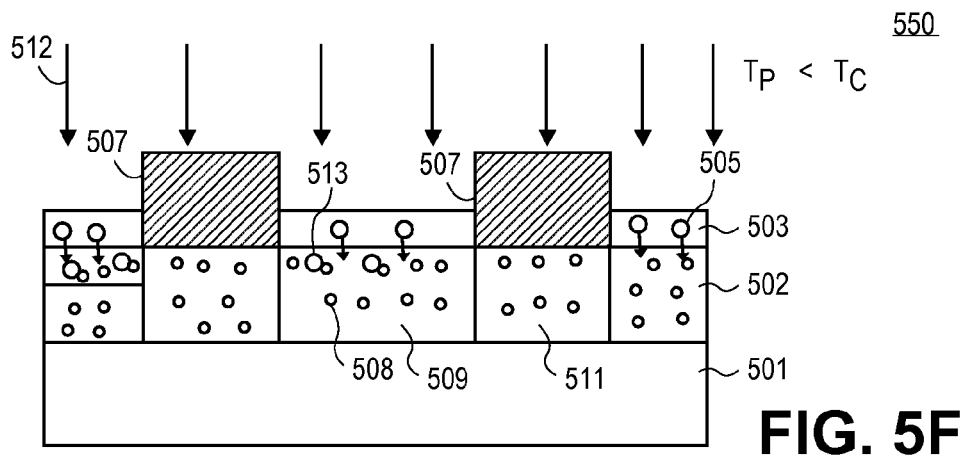
FIG. 5F is a view similar to FIG. 5E, illustrating annealing of the passivation layer according to one embodiment of the invention.

FIG. 5F is a view 550 similar to FIG. 5E, illustrating annealing of the passivation layer to deactivate an electrical activity of a dopant in a portion of the doped region of the solar cell according to one embodiment of the invention. As shown in FIG. 5F, chemical species 505 are driven into the portions of the doped region 502 outside the grid lines by annealing 512 at temperature Tp to deactivate an electrical activity of a dopant in these portions. As shown in FIG. 5F, at temperature Tp chemical species 505 are prevented from reaching the portions of the doped region 502 beneath the grid lines, such as portion 511 in sufficient quantities to significantly alter the active doping concentration. The electrical activity of the dopant is deactivated by forming electrically inactive complexes between dopant particles and chemical species 505, such as an electrically inactive complex 513. The chemical species react with the dopant particles and form the electrically inactive complex based on reacting. In an embodiment, the electrically inactive complex comprises the dopant particle bound to the atomic element of the chemical species. In one embodiment, the electrically inactive complex comprises a current carrier associated with the dopant (e.g., hole, electron) captured by the atomic element.

In an embodiment, for a $p^+$-type silicon region of the solar cell having boron, or any other acceptor dopant, the electrically inactive complex comprises a hole captured by the atomic hydrogen driven from the passivation layer by annealing at a temperature Tp. In an embodiment, for a $n^+$-type silicon region of the solar cell having phosphorous, or any other donor dopant, the electrically inactive complex is formed that comprises an electron captured by the atomic hydrogen driven from the passivation layer by annealing at a temperature Tp.

Figure 10:
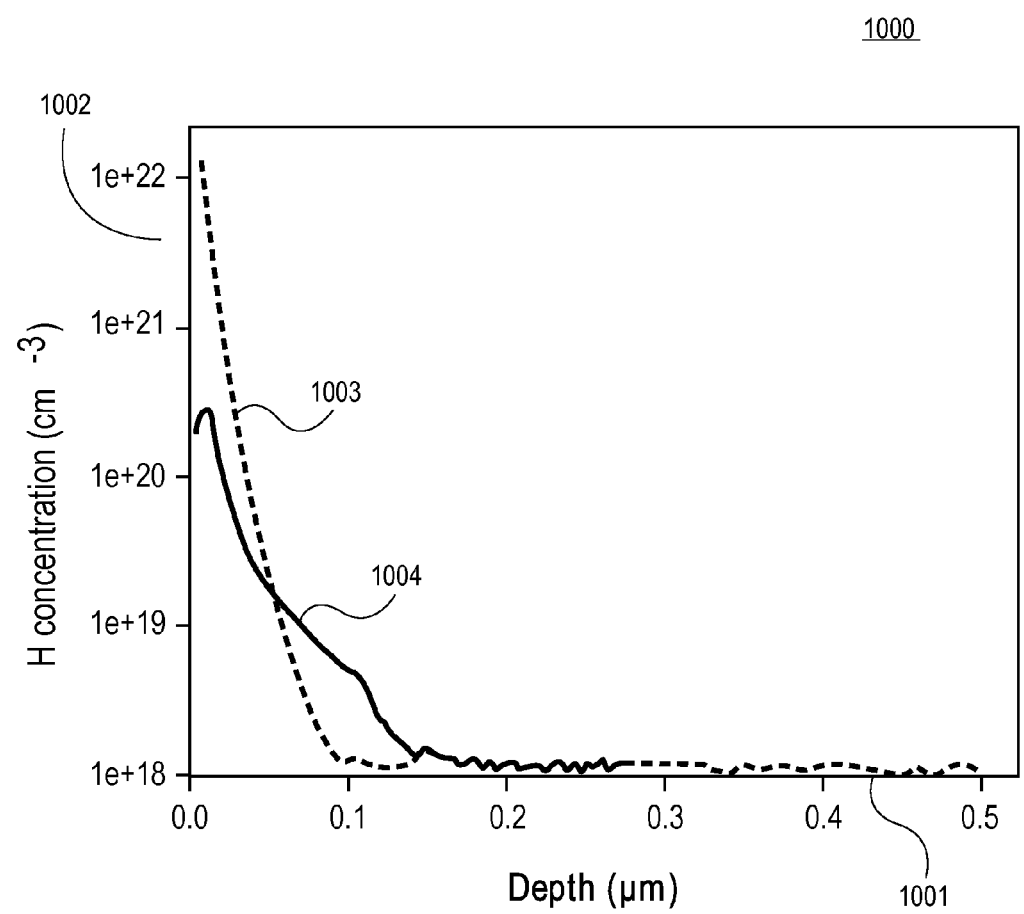
FIG. 10 shows a graph illustrating secondary ion mass spectroscopy profiles of a hydrogen concentration before and after annealing of the grid lines according to one embodiment of the invention.

FIG. 10 shows a graph 1000 illustrating secondary ion mass spectroscopy ("SIMS") profiles of a hydrogen concentration before (a dotted line 1003) and after (a solid line 1004) annealing of the grid lines to form ohmic-like contacts on a silicon nitride passivation layer coated wafer according to one embodiment. Profiles 1003 and 1004 illustrate the distribution of the hydrogen concentration along a depth 1001 from the surface of the wafer. An exemplary embodiment of a silicon nitride passivation layer coated wafer before annealing of the contacts can be represented by the view depicted in FIG. 5C. An exemplary embodiment of the silicon nitride passivation layer coated wafer after annealing the grid line contacts can be represented by the view depicted in FIG. 5E. The silicon nitride passivation layer was removed prior to the SIMS measurement. As shown in FIG. 10, a hydrogen concentration 1002 at a depth 1001 of about 0 microns ("μm") from the surface of the wafer before annealing the grid line contacts is greater than after annealing the contacts. At a depth from about 0.1 μm to about 0.15 μm the hydrogen concentration 1002 after annealing the grid line contacts is greater than before annealing the grid line contacts. As shown in FIG. 10, the amount of hydrogen left after annealing the grid lines is sufficient to deactivate enough boron to provide the device structure with a dopant profile having a concentration of electrically active dopants in a surface portion smaller than the concentration of electrically active dopants at a distance away from the surface portion, as described in further detail below.

Referring back to FIG. 5F, in an embodiment, the annealing temperature of the passivation layer Tp is lower than the annealing temperature of the grid lines Tc. In an embodiment, the annealing temperature Tp is from about 85 degree C. to about 400 degree C. In an embodiment, the annealing temperature Tp is from about −100 degree C. to about +1000 degree C. In an embodiment, the annealing temperature Tp is from about 85 degree C. to about 200 degree C. In an embodiment, the annealing temperature Tp is from about 200 degree C. to about 400 degree C. In an embodiment, the passivation layer is annealed at a plurality of temperatures Tp. In an embodiment, the annealing temperature Tp is maintained relatively high for a first period of time to drive the chemical species (e.g., hydrogen) into the silicon portions of the region of the solar cell outside the grid lines, and then is ramped down to deactivate the dopant in these portions during a second period of time. In an embodiment, the annealing temperature Tp is maintained relatively low for a first period of time to drive the chemical species (e.g., hydrogen) into the silicon portions of the region of the solar cell outside the grid lines, and then is ramped up to deactivate the dopant in these portions during a second period of time. In an embodiment, the first period of time is shorter than the second period of time. In an embodiment, the first period of time is longer than the second period of time.

In an embodiment, time of the annealing of the passivation layer, temperature of the annealing of the passivation layer, or both are adjusted to control deactivating of the electrical activity of the dopant. In an embodiment, one or more other parameters, for example, a concentration of the chemical species present in the passivation layer, a concentration of the chemical species in the anti-reflective coating, a concentration of the chemical species in the first portion of the region of the solar cell, or a combination thereof are adjusted to control deactivating of the electrical activity of the dopant. In an embodiment, the annealing of the passivation layer is performed for about 1 second to about 30 minutes.

Figure 5G:
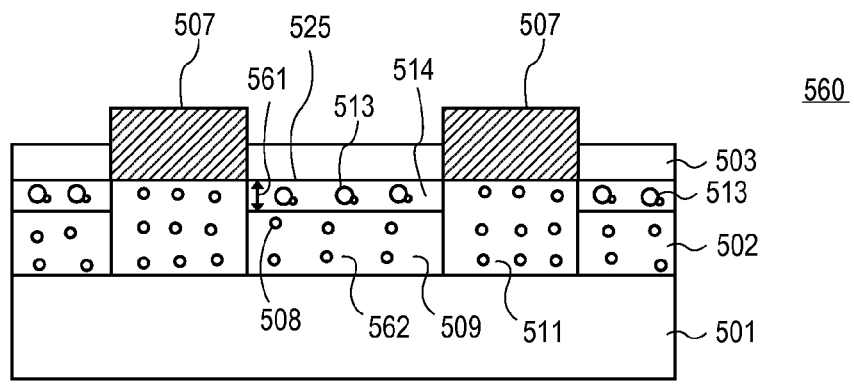
FIG. 5G is a view similar to FIG. 5F, after annealing of the passivation layer according to one embodiment of the invention.

FIG. 5G is a view similar to FIG. 5F, after annealing of the passivation layer according to one embodiment of the invention. As shown in FIG. 5G, portion 509 of the doped region 501 outside the grid line contacts 507 has a surface portion 514 and a portion 562 outside the surface portion. As shown in FIG. 5G, the surface portion comprises electrically inactive complexes 513 formed by reacting the dopant particles with the chemical species 505. The dopant particles 508 in portion 562 are electrically active. A dopant profile is generated that has a concentration of electrically active dopants in a surface portion 514 smaller than the concentration of electrically active dopants in the portion 562. The dopant particles are substantially not deactivated in portion 511 beneath the grid line contacts 507. In an embodiment, the active dopant concentration in the surface portion 514 is less than about $5 \times 10^{19}$ cm$^{-3}$, and the active dopant concentration in portion 562 is more than the active dopant concentration in the surface portion 514. In an embodiment, the active dopant concentration in portion 511 is more than about $5 \times 10^{19}$ cm$^{-3}$.

In an embodiment, the annealing temperature Tp is adjusted to control a distance 561 from the interface between the doped region 502 and passivation layer 503. A size of the surface portion 514 is determined by distance 561. In an embodiment, the passivation layer annealing time is adjusted to control distance 561. In an embodiment, a bias voltage is applied across the solar cell to control penetration of the chemical species 505 into the doped region to deactivate the dopant, as described below with respect to FIG. 8.

As shown in FIG. 5G, the electrical activity of the dopant in the portion 511 of the region underneath the grid line contact 507 is substantially not deactivated, and concentration of the active dopant particles, such as active dopant particle 508 in that region remains substantially the same as before annealing the passivation layer. In one embodiment, after annealing of the passivation layer, a total number of dopant particles including electrically active dopant particles and electrically deactivated dopant particles in the portion 509 of the region 502 outside the grid line contacts 507 is substantially the same as the total number of dopant particles in that portion prior to annealing. In one embodiment, after deactivating the dopant by atomic hydrogen by annealing the passivation layer at Tp, the active boron concentration outside of the grid line contacts is drastically reduced because around 99% of the boron at the surface of the doped region, such as surface portion 514, is inactivated. In portion 511 below the grid line contact, the active boron concentration does not change substantially because atomic hydrogen is driven out of the portion 511 by annealing the grid lines at temperature Tc.

In one embodiment, distance 561 is less than 0.1 µm. In one embodiment, distance 561 is from about 0.001 µm to about 0.1 µm. In one embodiment, distance 561 is from about 0.001 µm to about 0.2 µm. In one embodiment, the electrically active dopant concentration beneath the grid line contacts is more than one order of magnitude greater than the electrically active dopant concentration at the surface portion of the region of the solar cell outside the grid line. In one embodiment, the electrically active dopant concentration beneath the grid line is at least two orders of magnitude greater than the electrically active dopant concentration at the surface portion of the region of the solar cell outside the grid line. In an embodiment, the electrically active dopant concentration at the surface portion of the region of the solar cell outside the grid line is one or more orders of magnitude smaller than the electrically active dopant concentration at the portion of the region of the solar cell outside the grid line at a distance away from the surface portion. In an embodiment, the electrically active dopant concentration at the surface portion of the region of the solar cell outside the grid line is at least two orders of magnitude smaller than the electrically active dopant concentration at the portion of the region of the solar cell outside the grid line at a distance away from the surface portion. In one embodiment, about 99.99% of dopants are inactive in the surface portion of the region of the solar cell outside the grid line, such as surface portion 514. In one embodiment, the electrically active dopant concentration beneath the grid line is at least $10^{20}$ cm$^{-3}$, the electrically active dopant concentration at the surface portion of the region of the solar cell outside the grid line is from about $10^{16}$ cm$^{-3}$ to about $5 \times 10^{19}$ cm$^{-3}$, and the electrically active dopant concentration at the portion of the region of the solar cell outside the grid line at a distance away from the surface portion is at least $10^{20}$ cm$^{-3}$. In one embodiment, the selective emitter having a portion of the dopant deactivated by atomic hydrogen driven from the passivation layer by annealing at temperature Tp has significantly reduced active acceptor concentration in the surface portion (e.g., 99% dopants are inactive). This provides low series resistance and low surface recombination that enables higher Voc and Jsc without increasing series resistance enough to require more surface metallization. Smaller concentration of electrically active dopants at the surface provides excellent surface passivation to reduce the surface traps and higher concentration of electrically active dopants at a distance away from the surface keeps sheet resistance low.

Figure 6A:
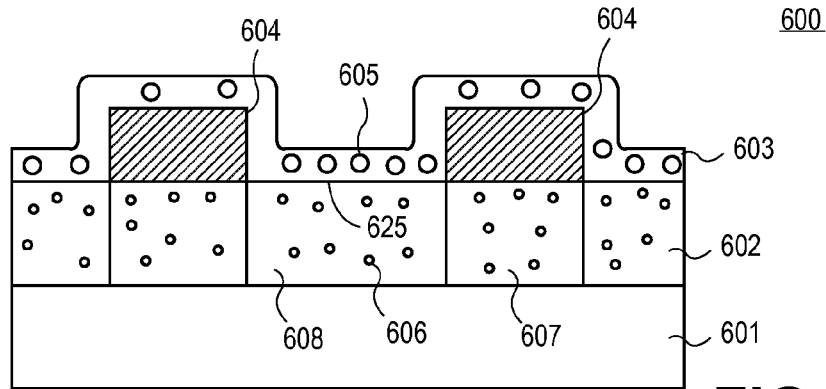
FIG. 6A is a cross-sectional view of a portion of a solar cell in a partially fabricated state according to another embodiment of the invention.

FIG. 6A is a cross-sectional view 600 of a portion of a solar cell in a partially fabricated state according to another embodiment of the invention. A view 600 can represent one of the solar cells depicted in FIGS. 2-3. A view 600 can represent a portion 410 of the solar cell along an axis A-A as depicted in FIG. 4. A substrate 601 represents one of the substrates described above with respect to FIGS. 2-5G. A doped region 602 represents one of the doped regions described above with respect to FIGS. 2-5G. Ohmic-like grid line contacts 604 are formed on portions of doped region 602, such as a portion 607. Doped region 602 has portions outside the grid line contacts 604, such as a portion 608.

In an embodiment, the grid line contacts 604 are formed by annealing the grid lines deposited directly on the portions of the doped region 602 at a temperature Tc. In an embodiment, the grid lines are deposited directly onto portions of the doped region by screen printing a metal paste onto the portions of the doped region 602. In an embodiment, the metal paste is silver, aluminum, or any other metal paste known to one of ordinary skill in the art of electronic device manufacturing. In an embodiment, the grid lines are deposited by electro-plating, e.g., using copper, or any other metal.

In an embodiment, the thickness of the grid line contacts 604 is from about 5 µm to about 200 µm. In an embodiment, the thickness of the grid line contacts is from about 5 µm to about 45 µm. In an embodiment, the grid line contacts are at least four times thicker than an AR coating and/or passivation layer deposited later in a process. In an embodiment, temperature Tc is substantially higher than 300 degree C. In an embodiment, the temperature Tc is from about 700 degree C. to about 900 degree C. In more specific embodiment, the temperature Tc is about 800 degree C. In one embodiment, the silver paste screen printed onto the doped region of the silicon solar cell substrate is heated to at least 700° C. to form an ohmic like contact to the doped silicon region. A passivation layer 603 is deposited on grid line contacts 604 and on the portions of the doped region 602 outside the grid line contacts 604, such as portion 608. A passivation layer 603 is deposited to reduce amount of the surface traps for carriers (electrons and/or holes) on the doped region 602 and to deactivate a portion of the dopant in a portion of the doped region 603, as described above. Passivation layer 603 comprises chemical species, such as a chemical species 605 to react with dopant particles, such as a dopant particle 606 of the dopant region 602 to form electrically inactive complexes. In an embodiment, chemical species 605 are formed at an interface 625 between passivation layer 603 and doped region 602. In an embodiment, chemical species 605 comprises atomic elements and diatomic elements (e.g., atomic hydrogen, deuterium, lithium, copper, or other atomic elements).

In an embodiment, the passivation layer containing chemical species 605 is hydrogen rich silicon nitride. In an embodiment, the passivation layer containing chemical species 605 is hydrogen rich silicon oxide. In an embodiment, the passivation layer containing chemical species 605 is hydrogen rich aluminum oxide. In an embodiment, the passivation layer containing chemical species 605 comprises silicon nitride, silicon oxide, aluminum oxide, or any combination thereof. In an embodiment, the passivation layer comprises $Si_xH_yN_z$, where y is from about 1% to about 70% by weight. In an embodiment, the passivation layer comprises any combination of silicon, nitrogen, oxygen, and hydrogen. In an embodiment, the hydrogen containing chemical species are formed at the interface 625 from the silicon nitride processing. In an embodiment, hydrogen chemical species are formed at interface 625 from a chemical reaction between silane and ammonia before the silicon nitride deposition. In an embodiment, a bias voltage (e.g., a steady-state voltage, a pulsed biasing, or both) is applied across doped region 602 on substrate 601 to simultaneously deposit passivation layer 603 and to introduce chemical species 605 onto doped region 602. In an embodiment, a portion of the dopant particles 606 is deactivated by the chemical species introduced during a bias voltage deposition of the passivation layer, as described in further detail below with respect to FIGS. 8 and 9.

Depending on an embodiment, passivation layer 603 has one of the thicknesses, as described above with respect to the passivation layer 503. In an embodiment, prior forming the passivation layer, the doped region on the silicon substrate having a (100) crystalline plane orientation, is etched predominantly along a (111) crystalline plane orientation to form pyramids (not shown) to trap the incident light, as described above.

In one embodiment, the passivation layer 603 is deposited at a temperature less than about 400 degree C. In an embodiment, the passivation layer is deposited onto the doped region using a plasma-enhanced chemical vapor deposition (PECVD) technique, or one of other passivation layer deposition techniques known to one of ordinary skill in the art of electronic device manufacturing. In an embodiment, an anti-reflective ("AR") coating (not shown) is deposited on the passivation layer to reduce light loss due to reflection and to direct the light into the solar cell, as described above.

Figure 6B:
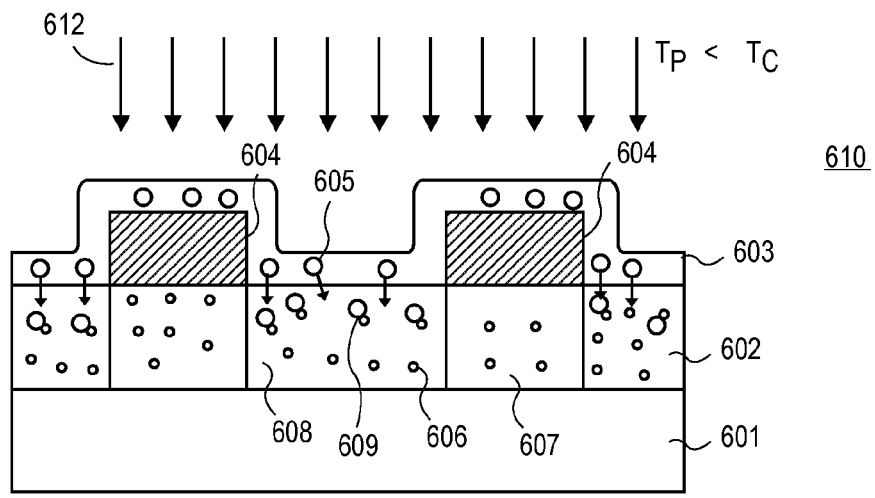
FIG. 6B is a view similar to FIG. 6A illustrating annealing of the passivation layer according to another embodiment of the invention.

FIG. 6B is a view 620 similar to FIG. 6A illustrating annealing of the passivation layer to deactivate an electrical activity of a dopant in a portion of the doped region of the solar cell according to another embodiment of the invention. As shown in FIG. 6B, chemical species 605 are driven into the portions of the doped region 602 outside the grid line contacts 604, such as a portion 608, by annealing 612 at a temperature Tp to deactivate an electrical activity of a dopant in these portions. As shown in FIG. 6B, the grid line contacts 604 act as a mask that prevents chemical species 605 from reaching the portions of the doped region 602 beneath the grid lines, such as portion 607. That is, the grid line contact acts a mask for deactivating the dopant. In one embodiment, the grid line contacts have enough thickness to prevent the atomic elements of chemical species from penetrating the underlying region of the solar cell.

The electrical activity of the dopant is deactivated by forming electrically inactive complexes between dopant particles and chemical species 605, such as an electrically inactive complex 609, as described above with respect to FIG. 5F. In an embodiment, the atomic hydrogen driven from the passivation layer reacts with the silver material of the grid line contacts instead of penetrating through the grid line contacts without reaching the underlying portion of the region of the solar cell, e.g., portion 607. In an embodiment, the annealing temperature of the passivation layer Tp is lower than the annealing temperature of the grid lines Tc, as described above with respect to FIG. 5F. In an embodiment, the annealing of the passivation layer is performed for a predetermined time duration from about 1 second to about 30 minutes.

Figure 6C:
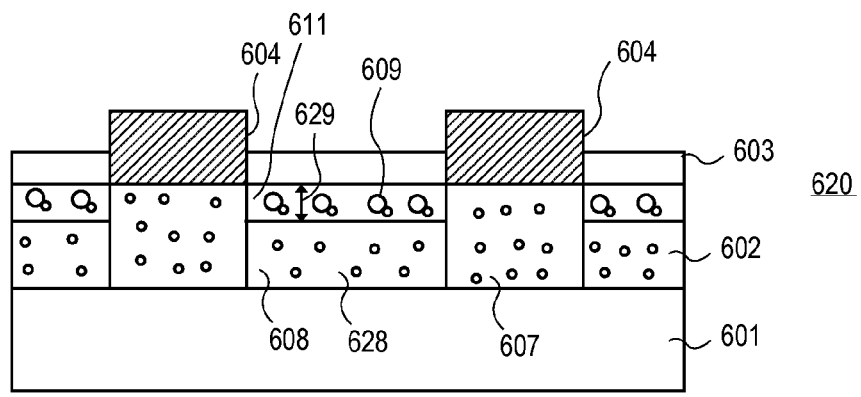
FIG. 6C is a view similar to FIG. 6B, after annealing of the passivation layer according to another embodiment of the invention.

FIG. 6C is a view similar to FIG. 6B, after annealing of the passivation layer according to another embodiment of the invention. As shown in FIG. 6C, portion 608 has a surface portion 611 and a portion 628 outside the surface portion. As shown in FIG. 6C, the surface portion 611 comprises electrically inactive complexes 609 formed by reacting the dopant particles with the chemical species 605 driven from passivation layer by annealing at temperature Tp. The dopant particles in portion 628 are electrically active. A dopant profile is generated that has a concentration of electrically active dopants in a surface portion 611 smaller than the concentration of electrically active dopants in the portion 628. The dopants particles are substantially not deactivated in portion 607 beneath the grid line contacts 604. In an embodiment, the active dopant concentration in the surface portion 611 is less than about $5 \times 10^{19}$ cm$^{-3}$, and the active dopant concentration in portion 628 is more than the active dopant concentration in the surface portion 611. In an embodiment, the active dopant concentration in portion 607 is more than about $5 \times 10^{19}$ cm$^{-3}$.

In an embodiment, the annealing temperature Tp is adjusted to control a distance 629 from the interface between the doped region 602 and passivation layer 603. A size of the surface portion 611 is determined by distance 629. In an embodiment, the passivation layer annealing time is adjusted to control depth 629. In an embodiment, a bias voltage is applied to the solar cell to control penetration of the chemical species 605 into the doped region 602 to deactivate the dopant, as described in further detail below with respect to FIG. 8.

As shown in FIG. 6C, the electrical activity of the dopant in the portion 607 is substantially not deactivated, and concentration of the active dopant particles in that region remains substantially the same as before annealing the passivation layer. In one embodiment, after annealing of the passivation layer, a total number of dopant particles including electrically active dopant particles and electrically deactivated dopant particles in the portion 608 is substantially the same as the total number of dopant particles in that portion prior to annealing. In one embodiment, after deactivating the dopant by atomic hydrogen by annealing the passivation layer at Tp, the active boron concentration outside of the grid line contacts is drastically reduced because around 99% of the boron at the surface of the doped region, such as surface portion 611, is inactivated. In portion 607, the active boron concentration does not change substantially because atomic hydrogen from passivation layer 603 is prevented from reaching portion 607 by grid line contact 604.

Depending on an embodiment, the distance 629 is one of the distances described above with respect to distance 561. In an embodiment, the electrically active dopant concentrations beneath the grid line contacts and at the surface portion of the region of the solar cell outside the grid line are similar to those described above with respect to FIG. 5G.

The doping profile in the doped region of the solar cell outside the grid line contacts generated by annealing the passivation layer as described above has just enough dopant inactivation or physical lack of active dopants at the surface of the otherwise highly doped region (e.g., selective emitter, back surface field) of the solar cell to decrease surface recombination. Unlike simply starting with a lightly doped emitter as in the conventional technique, this emitter can have low sheet resistance, eliminating power loss and avoiding the requirement of traditional selective emitters to increase number of grid lines.

Figure 7A:
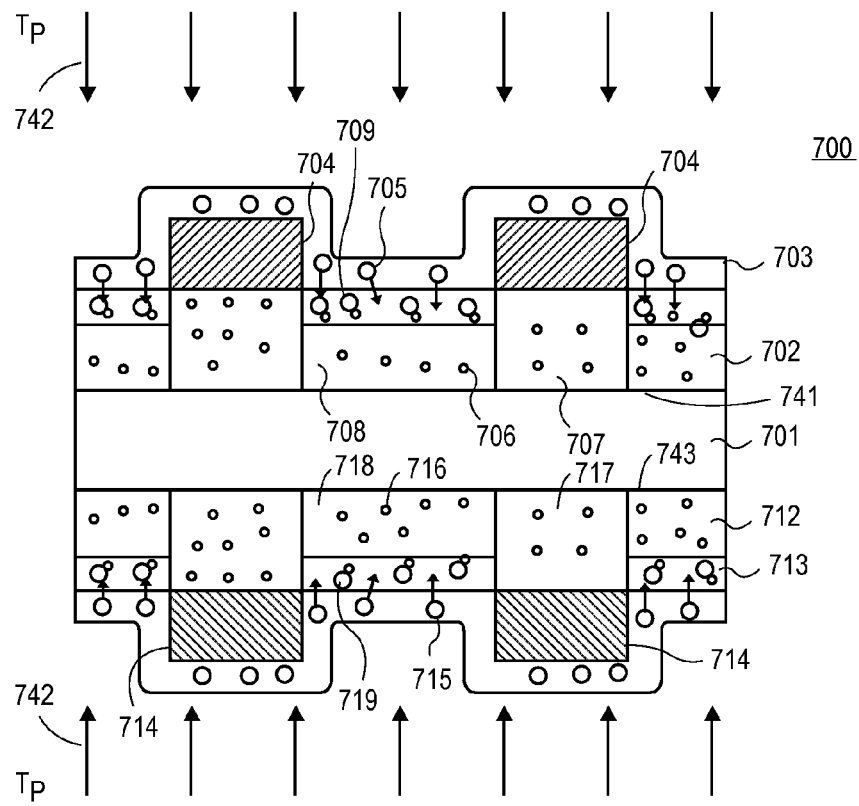
FIG. 7A is a cross-sectional view illustrating annealing of passivation layers of a bifacial selective emitter solar cell in a partially fabricated state according to one embodiment of the invention.

FIG. 7A is a cross-sectional view 700 illustrating annealing of passivation layers of a bifacial selective emitter solar cell in a partially fabricated state according to one embodiment. A view 700 can represent one of the solar cells depicted in FIGS. 2-3. A view 700 can represent a portion 410 of the solar cell along an axis A-A as depicted in FIG. 4. A solar cell substrate 1001 has a front surface 741 and a back surface 743. The solar cell substrate can be one of the solar cell substrates as described above. A selective emitter 702 is adjacent to the front surface 741 of the substrate. The selective emitter can be one of the selective emitters as described above. Conductive grid line contacts 704 are formed adjacent to a portion of the selective emitter 702. As shown in FIG. 7A, a back surface field 712 is adjacent to the back surface 743 of the substrate 701. In one embodiment, the back surface field has the same type of conductivity as the substrate 701. Back grid line contacts 714 are adjacent to the back surface field 712.

In an embodiment, the grid line contacts 704 are formed by annealing the grid lines deposited directly on the portions of the selector emitter 702 at a temperature Tc, as described above with respect to FIG. 6A. In an embodiment, back grid line contacts 714 are formed by annealing the grid lines deposited directly on the portions of the back surface field 712 at a temperature Tc, as described above with respect to FIG. 6A A passivation layer 703 comprising chemical species 705 is deposited on the portions of the selective emitter outside the grid line contacts, such as a portion 708 and on the grid line contacts 704, as described above with respect to FIG. 6A. In one embodiment, the passivation layer acts as AR coating, as described above. In an embodiment, an AR coating (not shown) is deposited on passivation layer 703, as described above. A passivation layer 713 comprising chemical species 715 is deposited onto the back surface field 712 and grid line contacts 714, as described above with respect to FIG. 6A. In one embodiment, an AR coating (not shown) is deposited onto the passivation layer, as described above. In one embodiment, passivation layer 713 acts as an AR coating, as described above.

In one embodiment, the selective emitter has a p-type dopant, and the substrate has an n-type dopant. In one embodiment, the selective emitter has an n-type dopant, and the substrate has a p-type dopant.

In an embodiment, the selective emitter 702 has an n-type dopant, the substrate 701 has a p-type dopant, and the back surface field 712 has a p-type dopant. In an embodiment, the back surface field 712 has a p-type dopant concentration higher (p+) than a p-type dopant concentration (p) in the substrate 701 to form an ohmic like contact with back grid lines 714. In another embodiment, the selective emitter has a p-type dopant, and the back surface field has an n-type dopant concentration higher (n+) than an n-type dopant concentration (n) in the substrate form an ohmic like contact with back grid line contacts 714. In one embodiment, the thickness of the selective emitter is from about 0.001 µm to about 2 µm. In one embodiment, the thickness of the back surface field is from about 0.001 µm to about 2 µm.

As shown in FIG. 7A, chemical species 705 are driven into the portions of the selective emitter 702 outside the grid line contacts 704, such as a portion 708 by annealing 742 at a temperature Tp to deactivate an electrical activity of a dopant in these portions. As shown in FIG. 7A, the grid line contacts 704 act as a mask that prevents chemical species 705 from reaching the portions of the selective emitter beneath the grid lines contacts, such as a portion 707.

As shown in FIG. 7A, chemical species 715 are driven into the portions of the back surface field 712 outside the grid line contacts 714, such as a portion 718 by annealing 742 at a temperature Tp to deactivate an electrical activity of a dopant in these portions. As shown in FIG. 7A, the grid line contacts 714 act as a mask that prevents chemical species 715 from reaching the portions of the selective emitter beneath the grid lines contacts, such as a portion 717, as described above with respect to FIG. 6B.

The electrical activity of a portion of the dopant is deactivated in selective emitter 702 by forming electrically inactive complexes, such as an electrically inactive complex 709 between the dopant particles, such as a dopant particle 706 and chemical species 705, as described above with respect to FIGS. 5F and 6B. The electrical activity of a portion of the dopant is deactivated in back surface field 712 by forming electrically inactive complexes, such as an electrically inactive complex 719 between the dopant particles, such as a dopant particle 716 and chemical species 715, as described above with respect to FIGS. 5F and 6B. In an embodiment, the annealing temperature of the passivation layers Tp is lower than the annealing temperature of the grid lines Tc, as described above with respect to FIGS. 5F and 6B. In an embodiment, the annealing of the passivation layers is performed for a predetermined time duration, as described above.

Figure 7B:
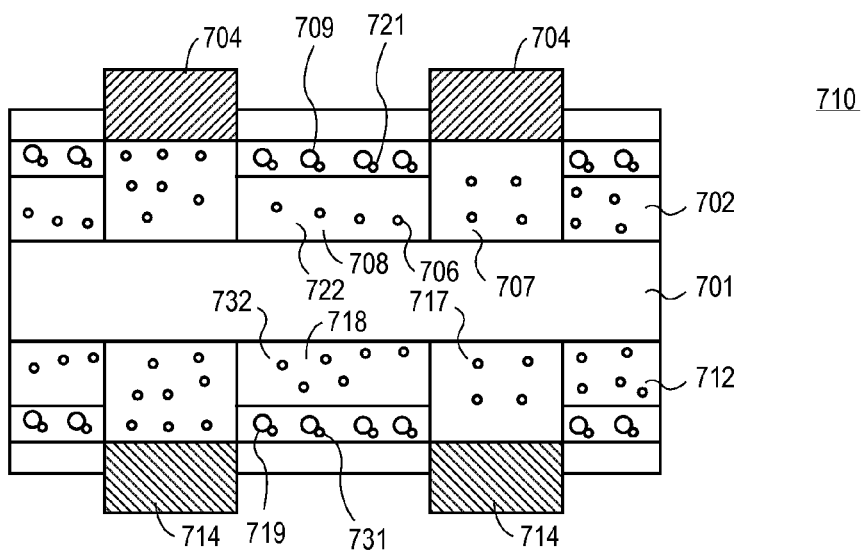
FIG. 7B is a view similar to FIG. 7A, after annealing of the passivation layers according to one embodiment of the invention.

FIG. 7B is a view similar to FIG. 7A, after annealing of the passivation layers according to one embodiment of the invention. As shown in FIG. 7B, portion 708 comprises a surface portion 721 and a portion 722 outside the surface portion. As shown in FIG. 7B, the surface portion 721 comprises electrically inactive complexes 709 formed by reacting the dopant particles with the chemical species 705 driven from passivation layer 703 by annealing at temperature Tp. The dopant particles in portion 722 are electrically active. A dopant profile is generated that has a concentration of electrically active dopants in a surface portion 721 smaller than the concentration of electrically active dopants in the portion 722. The dopant particles are substantially not deactivated in portion 707 beneath the grid line contacts 704, as described above with respect to FIG. 6A.

As shown in FIG. 7B, portion 732 comprises a surface portion 731 and a portion 732 outside the surface portion. As shown in FIG. 7B, the surface portion 731 comprises electrically inactive complexes 719 formed by reacting the dopant particles with the chemical species 715 driven from passivation layer 713 by annealing at temperature Tp. The dopant particles in portion 732 are electrically active. A dopant profile is generated that has a concentration of electrically active dopants in a surface portion 731 smaller than the concentration of electrically active dopants in the portion 732. The dopant particles are substantially not deactivated in portion 717 beneath the grid line contacts 714, as described above with respect to FIG. 6A.

Figure 8:
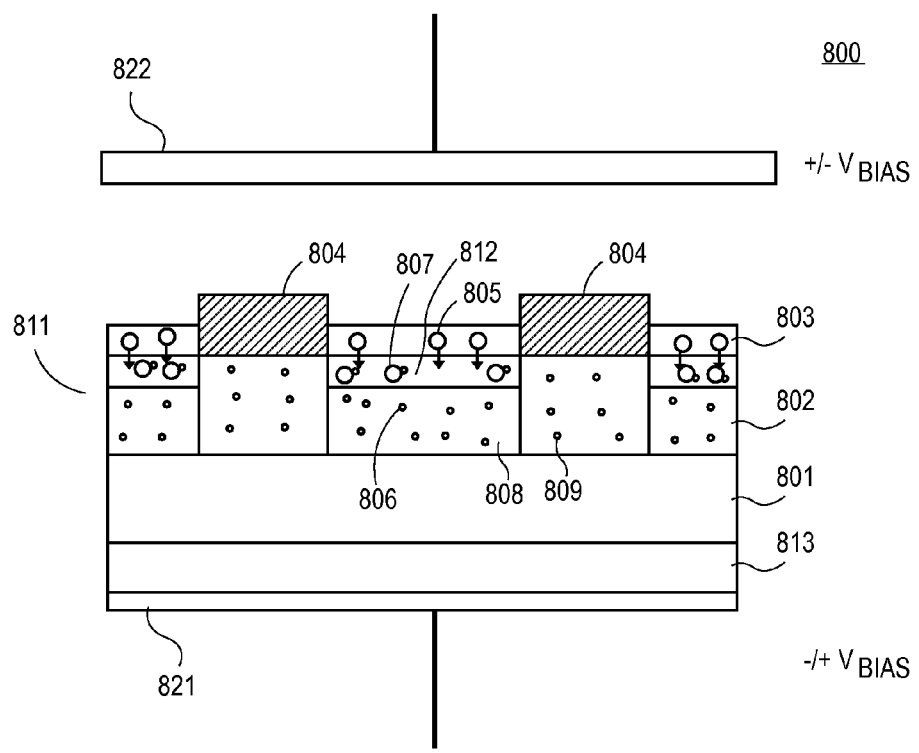
FIG. 8 is a view illustrating applying a bias voltage to deactivate a dopant in a portion of a solar cell according to one embodiment of the invention.

FIG. 8 is a view 800 illustrating applying a bias voltage to control deactivation of the electrical activity of a dopant in a portion of a solar cell according to one embodiment. As shown in FIG. 8, a solar cell 811 in a partially manufactured state is placed between electrodes 821 and 822 connected to a DC power supply (not shown). As shown in FIG. 8, the solar cell 811 is placed on a holder 813. A positive (+) to negative (−) DC bias voltage is applied to the solar cell 811 by electrodes. For example, when a negative bias voltage is applied to electrode 821, a positive bias voltage is applied to electrode 822, and vice versa. In an embodiment, the biasing voltage is applied to the electrode 821 with respect to electrode 822. In an embodiment, electrode 822 is a chamber wall, as described in further detail with respect to FIG. 9.

In an embodiment, the bias voltage applied across the solar cell is a steady-state voltage. In an embodiment, the bias voltage applied across the solar cell is a pulsed bias voltage that is turned on and off for a predetermined period of time.

In an embodiment, solar cell 811 represents one of the solar cells described above. As shown in FIG. 8, solar cell 811 comprises a doped region 802 formed on a substrate 801. Doped region 802 comprises dopant particles, such as a dopant particle 806. Grid line contacts 804 are formed on the portions of the doped region 802, such as a portion 809, as described above. A passivation layer 803 is deposited on the portions of the doped region 802 outside the grid line contacts 804, such as a portion 808. As shown in FIG. 8, a DC bias voltage is applied to the solar cell 811 to drive atomic elements of the chemical species 805 from the passivation layer 803 to deactivate the dopant particles in a surface portion 812. The dopant particles are deactivated by reacting with the chemical species driven from the passivation layer 803 by bias voltage to form electrically inactive complexes, such as an electrically inactive complex 807, as described above.

In an embodiment, a bias voltage (e.g., a steady-state voltage, a pulsed biasing, or both) is applied to electrodes 821 and 822 across doped region 802 on substrate 801 to simultaneously deposit passivation layer 803 and to introduce chemical species 805 onto doped region 802. In an embodiment, passivation layer 803 of silicon nitride is deposited using the processing gases containing silicon and nitrogen by applying a pulsed bias voltage to electrodes 822 and 821. The pulsed biasing deposition of the passivation layer introduces chemical species 805 (e.g., atomic elements and diatomic elements, e.g., atomic hydrogen, deuterium, lithium, copper, or other atomic elements) to deactivate at least a portion of the dopant particles 806. In an embodiment, the chemical species to deactivate a portion of the dopant particles 806 are introduced at the same time as the passivation layer is formed using the bias voltage.

In an embodiment, the bias voltage is applied to the solar cell when the passivation layer is annealed at temperature Tp to control the depth of the surface portion of the doped region containing the deactivated dopant particles, as described above. In an embodiment, the bias voltage applied to the solar cell is from about 1V to about 20 kV. In an embodiment, the bias voltage applied to the solar cell holder 813 is a negative bias voltage to attract positively charged chemical species (e.g., protons in the case of hydrogen) toward the cell that reach a sufficient velocity to penetrate through the passivation layer 803 to a desired depth. In an embodiment, a separate plasma is generated in addition to the DC biasing on the solar cell holder. The generated plasma acts as a source of positive ions to bombard a portion of the doped region of the solar cell. The plasma can be generated from an electron cyclotron resonance ("ECR"), a microwave, RF, a remote microwave, inductively coupled plasmas, glow discharge DC plasmas, or other sources of plasma. In an embodiment, the DC biasing to the solar cell also generates a plasma.

Figure 9:
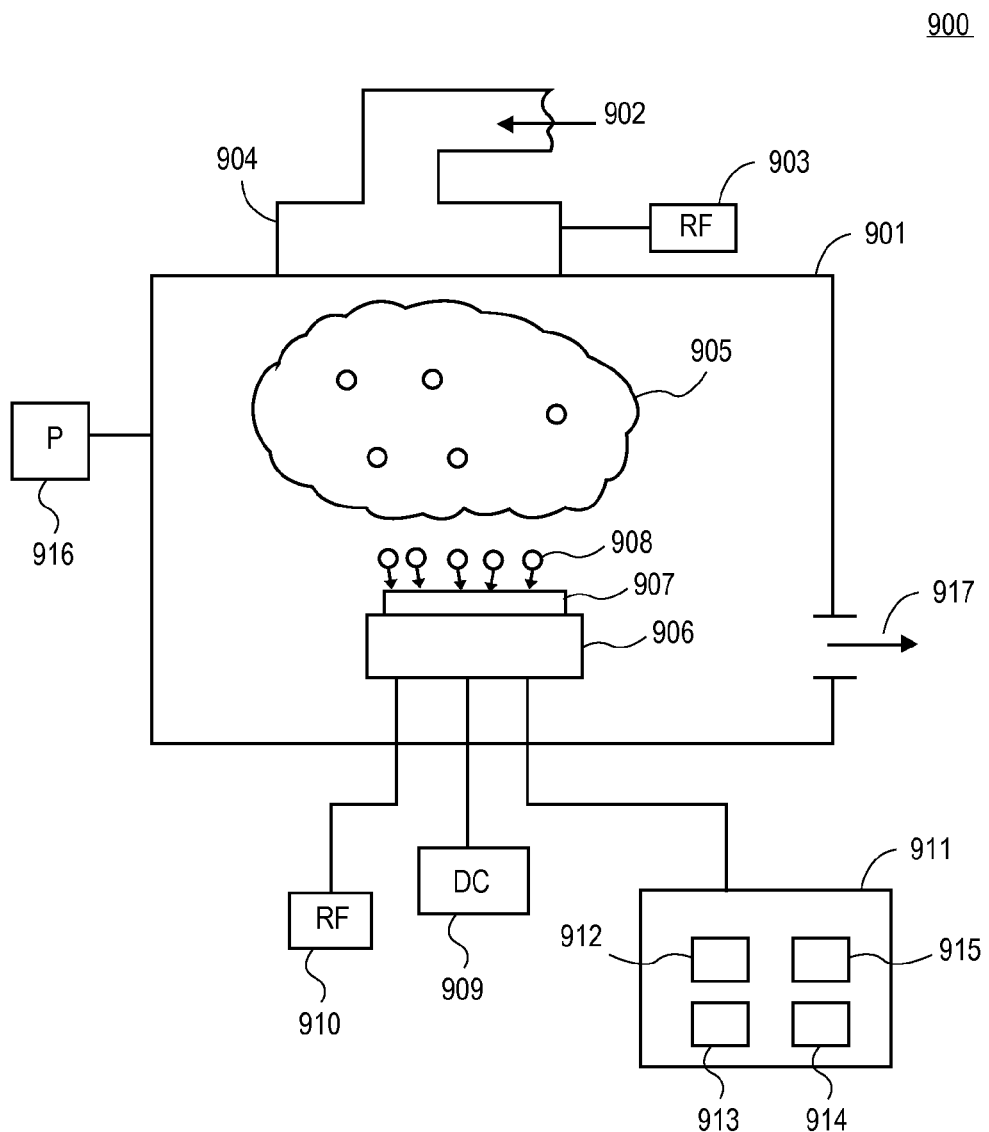
FIG. 9 is a view illustrating a plasma system to deactivate a dopant in a portion of a solar cell according to one embodiment of the invention.

FIG. 9 is a view illustrating a plasma system to deactivate a dopant in a portion of a solar cell according to one embodiment. As shown in FIG. 9, system 100 has a processing chamber 901. In an embodiment, processing chamber 101 is a plasma chamber. A pedestal 906 to hold a workpiece 907 is placed in processing chamber 901. In an embodiment, pedestal 906 comprises a DC electrode embedded into an electrostatic chuck (not shown). A DC power supply 909 is connected to the DC electrode of the pedestal 906. System 900 comprises an inlet to input one or more process gases 902 containing chemical species, e.g., hydrogen, deuterium, or other chemical species, as described above. As shown in FIG. 9, a plasma source 904 is coupled to a RF power supply 903.

In an embodiment, plasma source 904 is a remote plasma source. Plasma source 904 produces plasma 905 from one or more process gases 902 using a high frequency electric field. Plasma 905 comprising atomic elements (e.g., hydrogen atoms H, deuterium atoms D, other atomic elements), electrons, radicals, ions, or any combination thereof is generated from the chemical species of the gas by plasma source 905.

In an embodiment, workpiece 907 represents one of the solar cells described above. In an embodiment, workpiece 907 comprises a passivation layer deposited on a first portion of a doped region of the solar cell, and a grid line contact deposited on a second portion of the doped region of the solar cell, as described above with respect to FIG. 5C. In an embodiment, workpiece 907 comprises a first region formed on a substrate, the first region comprising a first portion and a second portion, a grid line deposited on the second portion, and a passivation layer deposited on the first portion and the grid line, as described above with respect to FIG. 6A.

The dopant in the portion of the region of the solar cell not covered by the grid line is exposed to atomic elements 908. In an embodiment, an electrical activity of the dopant is deactivated by exposure to the atomic elements. The dopant in the second portion of the region of the solar cell is not exposed to the atomic elements and is kept electrically active. The RF bias power from a RF source 910 is applied to the solar cell placed on pedestal 906 to control deactivating of the electrical activity of the dopant in the portion of the region of the solar cell not covered by the grid line.

In an embodiment, a bias power (e.g., a steady-state voltage, a pulsed biasing, or both) is applied to pedestal 906 to create an electrical field across workpiece 907 to simultaneously deposit a passivation layer on the doped region on the substrate and to introduce chemical species 908 onto the doped region. In an embodiment, the passivation layer of silicon nitride is deposited from plasma 905 containing silicon and nitrogen generated the processing gases 902 by applying a pulsed bias voltage to pedestal 906. The chemical species 908 (e.g., atomic elements and diatomic elements, e.g., atomic hydrogen, deuterium, lithium, copper, or other atomic elements) from plasma 905 are introduced on the doped region on the substrate at the same time as the passivation layer is formed. The pulsed biasing deposition of the passivation layer introduces the chemical species to deactivate at least a portion of the dopant particles. In an embodiment, a portion of the dopant particles are deactivated by the chemical species introduced at the same time as the passivation layer is formed using the bias voltage.

In an embodiment, a separate plasma is generated in addition to the DC biasing on the solar cell holder. The generated plasma acts as a source of positive ions to bombard a portion of the doped region of the solar cell. The plasma can be generated from an electron cyclotron resonance ("ECR"), a microwave, RF, a remote microwave, inductively coupled plasmas, glow discharge DC plasmas, or other sources of plasma. In an embodiment, the DC biasing to the solar cell also generates a plasma. In an embodiment, the RF bias power is used to energize the atomic elements generated by plasma source 904 to deactive a dopant in the doped region of the solar cell. In an embodiment, the plasma bias power 119 has a frequency between about 2 MHz to about 60 MHz. In an embodiment, a bias voltage from RF power source 910 is from about −1 Volt ("V") to about −20 kiloVolts ("kV").

In an embodiment, a plasma is generated by the RF power or any other plasma source. Then a separate DC biasing is used to attract the positive ions from that plasma toward the solar cell. The applied DC voltage is used to bring the hydrogen chemical species (e.g., protons) near the surface of a portion of the doped region of the cell. The protons penetrate the surface of the portion of the doped region of the cell, inactivating the dopants.

As shown in FIG. 9, a pressure control system 916 provides a pressure to processing chamber 901. As shown in FIG. 9, chamber 901 is evacuated via an exhaust outlet 917. A controller 911 is coupled to the chamber 901. The controller 911 comprises a processor 912, a temperature controller 913 coupled to the processor 912, a memory 915 coupled to the processor 912, and an input/output devices 914 coupled to the processor 912 to control the processing chamber 901 to perform one or more methods and functions described herein. In at least some embodiment, at least one of a pressure and a temperature applied to the chamber is adjusted to control deactivating of the dopant.

In one embodiment, a pressure range used for deactivating the dopant in the processing chamber is from about 1 mTorr to about 10 Torr. In an embodiment, the flow rate of hydrogen gas depends the size of the chamber, pressure applied to the chamber, or both. In one embodiment, the flow rate of the hydrogen gas is from about 1 standard cubic centimeters per minute (sccm) to about 10 standard cubic liters per minute (SLM). In one embodiment, the flow rate of the hydrogen gas is about 20 sccm. In an embodiment, the plasma system 900 is a plasma-enhanced chemical vapor deposition (PECVD) system.

Figure 11:
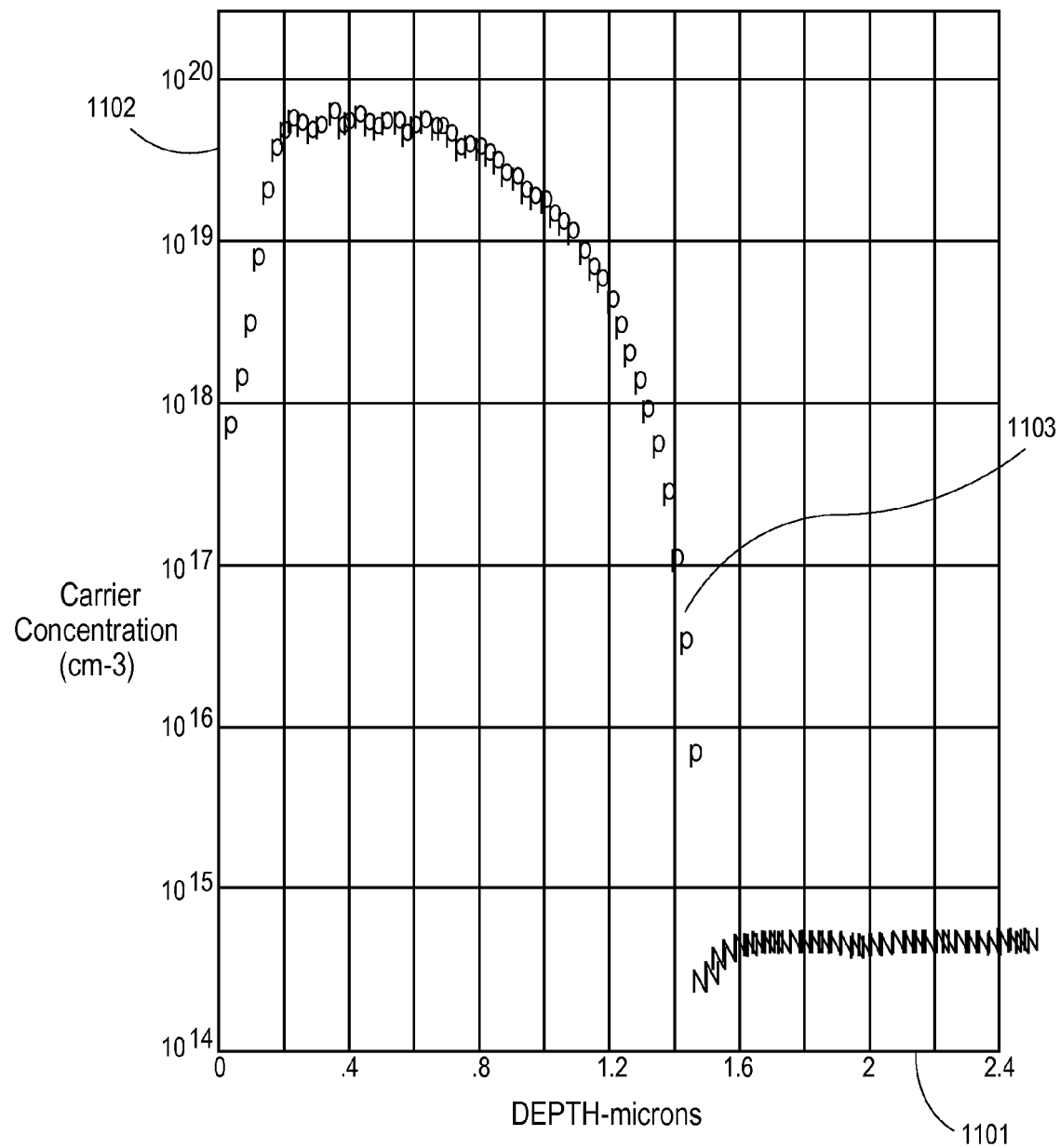
FIG. 11 is a graph illustrating reduction of an active dopant concentration at the surface of the doped region of the solar cell after deactivation according to one embodiment of the invention.

FIG. 11 is a graph 1100 illustrating reduction of the active dopant (carrier) concentration at the surface of the doped region of the solar cell after deactivation according to one embodiment of the invention. FIG. 11 depicts a carrier concentration after deactivation 1102 against a depth 1101 of a doped region of a silicon solar cell. Depth 1101 indicates a distance from the surface of the doped region. The carrier concentration is obtained by measuring a resistance of the doped region of the silicon solar cell outside the grid lines as a function of the depth (a resistance profile). As shown in FIG. 11, after deactivation, an active dopant concentration profile after deactivation 1103 has the carrier concentration that increases from about $5 \times 10^{17}$ cm$^{-3}$ at the surface (0 depths) to about $8 \times 10^{19}$ cm$^{-3}$ at the depth of about 0.2 μm. In an embodiment, the active dopant having the doping profile 1103 is boron, or other dopant as described herein.

In the foregoing specification, embodiments of the invention have been described with reference to specific exemplary embodiments thereof. It will be evident that various modifications may be made thereto without departing from the broader spirit and scope of the embodiments of the invention. The specification and drawings are, accordingly, to be regarded in an illustrative sense rather than a restrictive sense.

What is claimed is:

1. A method to manufacture a solar cell comprising:
   depositing a passivation layer comprising chemical species on a first portion of a region of the solar cell, wherein a grid line is deposited on a second portion of the region;
   annealing the grid line at a first temperature to form an electrical contact on the second portion;
   annealing the passivation layer at a second temperature that is less than the first temperature to drive the chemical species from the passivation layer to deactivate an electrical activity of the dopant in a surface portion of the first portion while having the electrical activity of the dopant in a remaining portion of the first portion underneath the surface portion intact by the annealing at the second temperature, wherein the depth of the surface portion between the passivation layer and the remaining portion is less than 0.2 microns.

2. The method of claim 1, wherein the electrical activity of the dopant in the first portion is deactivated by reacting the dopant with the chemical species from the passivation layer to form an electrically inactive complex.

3. The method of claim 1, wherein the passivation layer is silicon nitride, silicon oxide, aluminum oxide, or any combination thereof, and wherein the chemical species comprises atomic hydrogen, deuterium, lithium, copper, or any combination thereof.

4. The method of claim 1, wherein
   a dopant profile having a concentration of active dopants at the surface portion of the first portion that is smaller than the concentration of active dopants in the remaining portion is generated by annealing of the passivation layer at the second temperature, wherein the remaining portion is greater in size than the surface portion.

5. The method of claim 1, further comprising
   applying a bias voltage to the solar cell to control deactivating.

6. The method of claim 1, wherein the first temperature is from 85 degrees C. to 200 degrees C.

7. The method of claim 1, wherein the thickness of the passivation layer is from 1 nanometers to 500 nanometers.

8. The method of claim 1, wherein the annealing of the passivation layer comprises
   maintaining the second temperature for a first period of time to drive the chemical species into the surface portion; and
   ramping down the second temperature to a third temperature for a second period of time to deactivate the electrical activity of the dopant in the surface portion, wherein the first period of time is shorter than the second period of time.

9. The method of claim 1, wherein the passivation layer is deposited on a top of the grid line that acts as a mask to prevent the chemical species from deactivating the dopant in the second portion.

10. A method to manufacture a solar cell, comprising:
depositing a passivation layer comprising chemical species on a region of the solar cell, the region comprising a first portion and a second portion;
depositing a grid line on the passivation layer over the second portion;
annealing the grid line at a first temperature to form an electrical contact on the second portion; and
annealing the passivation layer at a second temperature that is less than the first temperature to drive the chemical species from the passivation layer to deactivate an electrical activity of a dopant in a surface portion of the first portion while having the electrical activity of the dopant in a remaining portion of the first portion underneath the surface portion intact by the annealing at the second temperature, wherein the depth of the surface portion between the passivation layer and the remaining portion is less than 0.2 microns.

11. The method of claim 10, wherein the passivation layer comprises silicon nitride, silicon oxide, aluminum oxide, or any combination thereof, and wherein the chemical species comprises hydrogen, deuterium, lithium, copper, or any combination thereof.

12. The method of claim 10, further comprising
applying a bias voltage to the solar cell to control deactivating.

13. The method of claim 10, wherein the thickness of the passivation layer is from 1 nanometers to 500 nanometers.

14. The method of claim 10, wherein the annealing of the passivation layer comprises
maintaining the second temperature for a first period of time to drive the chemical species into the surface portion and
ramping down the second temperature to a third temperature for a second period of time to deactivate the electrical activity of the dopant in the surface portion, wherein the first period of time is shorter than the second period of time, wherein the second temperature is from 85 degrees C. to 200 degrees C.

15. The method of claim 10, wherein the dopant is boron (B), aluminum (Al), gallium (Ga), indium (In), thallium (Tl), hydrogen, or any combination thereof.

16. The method of claim 10, wherein the dopant is at nitrogen (N), phosphorus (P), arsenic (As), antimony (Sb), and bismuth (Bi), hydrogen, or any combination thereof.

17. A method to manufacture a solar cell comprising:
supplying chemical species to a first portion of a region of a solar cell placed in a chamber, wherein a passivation layer comprising the chemical species is deposited on the first portion, and a grid line is deposited over a second portion of the region; and
deactivating an electrical activity of a dopant in a surface portion of the first portion using the chemical species from the passivation layer while having the electrical activity of the dopant in a remaining portion of the first portion underneath the surface portion intact by applying a bias voltage to the solar cell, wherein the depth of the surface portion between the passivation layer and the remaining portion is less than 0.2 microns.

18. The method of claim 17, wherein the dopant in the second portion is electrically active, the passivation layer is deposited on a top of the grid line, and wherein the grid line is used as a mask for deactivating.

19. The method of claim 17, wherein the bias voltage is one of a steady-state voltage, and a pulsed voltage.

20. The method of claim 17, further comprising
annealing the passivation layer at a first temperature to drive chemical species from the passivation layer to deactivate the electrical activity of the dopant in the surface portion, wherein the first temperature is from 85 degrees C. to 200 degrees C.

21. The method of claim 17, wherein the chemical species have a predetermined concentration to control the deactivating.

22. The method of claim 17, wherein the electrical activity of the dopant in the surface portion is deactivated using the chemical species supplied to the surface portion during the passivation layer deposition.

23. The method of claim 1, further comprising annealing the passivation layer at a third temperature that is different from the second temperature.

* * * * *